United States Patent
Steps et al.

(10) Patent No.: US 10,151,793 B2
(45) Date of Patent: Dec. 11, 2018

(54) ELECTRONICS TESTER WITH DOUBLE-SPIRAL THERMAL CONTROL PASSAGE IN A THERMAL CHUCK

(71) Applicant: AEHR TEST SYSTEMS, Fremont, CA (US)

(72) Inventors: Steven C. Steps, Saratoga, CA (US); Scott E. Lindsey, Brentwood, CA (US); Kenneth W. Deboe, Santa Clara, CA (US); Donald P. Richmond, II, Palo Alto, CA (US); Alberto Calderon, San Jose, CA (US)

(73) Assignee: AEHR TEST SYSTEMS, Fremont, CA (US)

( * ) Notice: Subject to any disclaimer, the term of this patent is extended or adjusted under 35 U.S.C. 154(b) by 0 days.

(21) Appl. No.: 15/823,290

(22) Filed: Nov. 27, 2017

(65) Prior Publication Data

US 2018/0080981 A1    Mar. 22, 2018

Related U.S. Application Data

(62) Division of application No. 15/293,156, filed on Oct. 13, 2016, now Pat. No. 9,857,418, which is a division (Continued)

(51) Int. Cl.
*G01R 31/00* (2006.01)
*G01R 31/28* (2006.01)
*G01R 1/04* (2006.01)

(52) U.S. Cl.
CPC ....... *G01R 31/2875* (2013.01); *G01R 1/0491* (2013.01); *G01R 31/2856* (2013.01);

(Continued)

(58) Field of Classification Search
CPC ............ G01R 31/2856; G01R 31/2875; G01R 31/2877; G01R 31/2863; G01R 1/0491;

(Continued)

(56) References Cited

U.S. PATENT DOCUMENTS

| 5,515,126 A | 5/1996 | Baxter et al. |
| 5,517,126 A | 5/1996 | Yamaguchi |

(Continued)

FOREIGN PATENT DOCUMENTS

| CN | 100348982 C | 11/2007 |
| DE | 3914669 A1 | 11/1989 |

(Continued)

OTHER PUBLICATIONS

Japanese Office Action—dated Jul. 18, 2017 (with English translation), Japanese Patent Application No. 2016-184497, (9 pages).

*Primary Examiner* — Tung X Nguyen
(74) *Attorney, Agent, or Firm* — Stephen M. De Klerk

(57) ABSTRACT

The invention relates to a tester apparatus of the kind including a portable supporting structure for removably holding and testing a substrate carrying a microelectronic circuit. An interface on the stationary structure is connected to the first interface when the portable structure is held by the stationary structure and is disconnected from the first interface when the portable supporting structure is removed from the stationary structure. An electrical tester is connected through the interfaces so that signals may be transmitted between the electrical tester and the microelectronic circuit to test the microelectronic circuit.

76 Claims, 17 Drawing Sheets

Related U.S. Application Data of application No. 15/015,051, filed on Feb. 3, 2016, now Pat. No. 9,500,702, which is a division of application No. 14/741,273, filed on Jun. 16, 2015, now Pat. No. 9,291,668, which is a division of application No. 13/474,581, filed on May 17, 2012, now Pat. No. 9,086,449, which is a division of application No. 13/022,803, filed on Feb. 8, 2011, now Pat. No. 8,198,909, which is a division of application No. 12/684,051, filed on Jan. 7, 2010, now Pat. No. 7,902,846, which is a division of application No. 12/062,988, filed on Apr. 4, 2008, now Pat. No. 7,667,475.

(60) Provisional application No. 60/910,433, filed on Apr. 5, 2007.

(52) U.S. Cl.
CPC ..... *G01R 31/2863* (2013.01); *G01R 31/2865* (2013.01); *G01R 31/2879* (2013.01); *G01R 31/2889* (2013.01)

(58) Field of Classification Search
CPC ............ G01R 31/2879; G01R 31/2886; G01R 31/2887; G01R 1/07314; G01R 3/00
See application file for complete search history.

(56) References Cited

U.S. PATENT DOCUMENTS

| | | |
|---|---|---|
| 5,886,535 A | 3/1999 | Budnaitis |
| 5,945,834 A | 8/1999 | Nakata et al. |
| 6,005,401 A | 12/1999 | Nakata et al. |
| 6,084,419 A | 7/2000 | Sato et al. |
| 6,094,059 A | 7/2000 | Frankey et al. |
| 6,094,060 A | 7/2000 | Frankeny et al. |
| 7,053,644 B1 | 5/2006 | Lindsey et al. |
| 7,332,918 B2 | 2/2008 | Sugiyama et al. |
| 7,480,129 B2 * | 1/2009 | Brown ................. H01L 21/6831 361/234 |
| 2002/0003432 A1 | 1/2002 | Leas et al. |
| 2002/0066726 A1* | 6/2002 | Cole, Sr. ............. G01R 31/2891 219/444.1 |
| 2003/0122550 A1 | 7/2003 | Kanamaru et al. |
| 2003/0237061 A1 | 12/2003 | Miller et al. |
| 2006/0125502 A1 | 6/2006 | Lindsey et al. |
| 2006/0139042 A1 | 6/2006 | Kasukabe |
| 2006/0186904 A1 | 8/2006 | Natsuhara et al. |
| 2007/0001790 A1 | 1/2007 | Richmond, II et al. |
| 2007/0029979 A1 | 2/2007 | Williams et al. |
| 2007/0273216 A1 | 11/2007 | Farbarik |
| 2009/0015282 A1 | 1/2009 | Steps |
| 2010/0175866 A1 | 7/2010 | Tani et al. |
| 2010/0213960 A1 | 8/2010 | Mok et al. |
| 2012/0229159 A1 | 9/2012 | Kim et al. |
| 2013/0342236 A1 | 12/2013 | Song et al. |

FOREIGN PATENT DOCUMENTS

| | | |
|---|---|---|
| EP | 0320660 A2 | 6/1989 |
| GB | 2285348 A | 7/1995 |
| JP | 08-005666 A | 1/1996 |
| JP | 08-340030 A | 12/1996 |
| JP | 09-115971 | 5/1997 |
| JP | 10-256325 A | 9/1998 |
| JP | 2001-203244 A | 7/2001 |
| JP | 2002-43381 A | 2/2002 |
| WO | 2006/009061 | 1/2006 |
| WO | 2006/116767 A1 | 11/2006 |

* cited by examiner

ELECTRONICS TESTER WITH DOUBLE-SPIRAL THERMAL CONTROL PASSAGE IN A THERMAL CHUCK

CROSS-REFERENCE TO RELATED APPLICATIONS

This application is a division of U.S. patent application Ser. No.: 15/293,156, filed on Oct. 13, 2016, which is a division of U.S. patent application Ser. No.: 15/015,051, filed on Feb. 3, 2016 now U.S. Pat. No.: 9,500,702, which is a division of U.S. patent application Ser. No.: 14/741,273, filed on Jun. 16, 2015 now U.S. Pat. No.: 9,291,668, which is division of U.S. patent application Ser. No.: 13/474,581, filed on May 17, 2012 now U.S. Pat. No.: 9,086,449, which is a division of U.S. patent application Ser. No.: 13/022,803, filed on Feb. 8, 2011 now U.S. Pat. No.: 8,198,909, which is a division of U.S. patent application Ser. No.: 12/684,051, filed on Jan. 7, 2010 now U.S. Pat. No.: 7,902,846, which is a division of U.S. patent application Ser. No.: 12/062,988, filed on Apr. 4, 2008 now U.S. Pat. No.: 7,667,475, which claims priority from U.S. Provisional Patent Application No. 60/910,433, filed on Apr. 5, 2007, which are incorporated herein by reference in their entirety.

BACKGROUND OF THE INVENTION

1). Field of the Invention

This invention relates to an apparatus that is used for full-wafer testing and/or burn-in testing and/or built-in self-testing.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and electronic communication with an integrated or microelectronic circuit of the die. Final packaging may include encapsulation of the die and the resulting package can then be shipped to a customer.

It is required that the die or the package be tested before being shipped to a customer. Ideally, the die should be tested at an early stage for the purposes of identifying the defects that occur during early-stage manufacturing.

The earliest stage that a die can be tested is after completion of the manufacture of microelectronic circuits at wafer level and before a wafer is singulated. Full wafer testing carries with it a number of challenges. One challenge in full wafer testing is that there is a large amount of contacts on a wafer and that a large number of power, ground, and signal connections thus have to be made. Another challenge is that burn-in testing requires a thermal management system that can maintain the wafer stable at a relatively high temperature, while providing a system that is simple to operate and relatively inexpensive.

SUMMARY OF THE INVENTION

A portable pack is provided, including a portable supporting structure for holding a substrate carrying a microelectronic circuit and having a plurality of terminals connected to the microelectronic circuit, a plurality of contacts on the portable supporting structure, the contacts matching the terminals for making contact to the terminals, a first interface on the portable supporting structure and connected to the contacts, for connection to a second interface on a stationary structure when the portable supporting structure is removably held by the stationary structure.

The portable supporting structure may include first and second components for holding the substrate therebetween, the contacts located on the second component, and the components being movable relative to one another to ensure proper contact between the contacts and the terminals.

The second component may include a signal distribution board and a contactor, wherein a CTE ratio of a CTE of the signal distribution board to a CTE of the contactor is not equal to 1. The contactor may heat from a first contactor temperature to a second contactor temperature during testing of the microelectronic circuit, and the signal distribution board heats from a first signal distribution board temperature to a second signal distribution board temperature, and a temperature change ratio, being a difference between the second signal distribution board temperature and the first signal distribution board temperature to a difference between the second contactor temperature and the first contactor temperature, multiplied by the CTE ratio, is closer to 1 than the CTE ratio.

The coefficient of thermal expansion ratio multiplied by the temperature change ratio may be between 0.8 and 1.2.

The first component may be a substrate chuck having a surface supporting the substrate.

The portable pack may further include a pressure differential cavity seal between the first and second components, the pressure differential cavity seal forming an enclosed pressure differential cavity together with surfaces of the first and second components, and a pressure reduction passage within the pressure differential cavity through which air can be removed from the pressure differential cavity to move the first and second components relatively towards one another.

The pressure differential cavity seal may surround the contacts and the terminals.

The pressure differential cavity seal may be secured to the first component when the first and second components are apart.

The pressure differential cavity seal may be a lip seal.

A pressure reduction passage may be formed through one of the components, the pressure reduction passage having an inlet opening at the pressure differential cavity and an outlet opening outside the pressure differential cavity, and a first valve in the component having the pressure reduction passage, opening of the first valve allowing air out of the pressure differential cavity and closing of the valve keeping air from entering the pressure differential cavity.

The first valve may be a check valve, a vacuum release passage being formed through the component having the check valve, the vacuum release passage having an inlet opening at the pressure differential cavity and an outlet opening outside the pressure differential cavity, and a second, vacuum release valve in the component having the vacuum release passage, opening of the vacuum release valve allowing air into the pressure differential cavity and closing of the valve keeping air from escaping out of the pressure differential cavity.

The portable pack may further include a substrate suction passage in the first component, through which air can be pumped to reduce a pressure on a side of the substrate facing the first component to hold the substrate against the first component.

The contacts may be resiliently depressible by the terminals, the portable pack further including a stand-off on the second component, the stand-off having a surface that limits depression of at least one of the contacts.

A plurality of separated stand-offs may be located between the contacts.

The portable pack may further include a layer having a first side that is adhesive and attached to the second component, and a second, opposite side that is adhesive, and the stand-off may be attached to the second side.

The first interface may include a plurality of lands and the second interface may include a plurality of members having contact surfaces that match with the lands, and are resiliently depressible by the lands, allowing for movement relative to the structure of the stationary structure.

The lands and the terminals may be in parallel planes.

The substrate may be a wafer with a plurality of microelectronic circuits.

The contacts may be pins, each pin having a spring that may be depressed against a spring force thereof when the respective contact is depressed by a respective one of the terminals.

The invention also relates to a tester apparatus of the kind including a portable supporting structure for holding a substrate carrying a microelectronic circuit and having a plurality of terminals connected to the microelectronic circuit, a plurality of contacts on the portable supporting structure, the contacts matching the terminals for making contact to the terminals, a first interface on the portable supporting structure and connected to the contacts, a stationary structure, the portable supporting structure being receivable to be held by the stationary structure and being removable from the stationary structure, a second interface on the stationary structure, the second interface being connected to the first interface when the portable structure is held by the stationary structure and being disconnected from the first interface when the portable supporting structure is removed from the stationary structure, and an electrical tester connected through the second interface, the first interface, and the contacts to the terminals so that signals may be transmitted between the electrical tester and the microelectronic circuit to test the microelectronic circuit.

The portable supporting structure may include first and second components for holding the substrate therebetween, the contacts located on the second component, and the components being movable relative to one another to ensure proper contact between the contacts and the terminals.

The second component may include a signal distribution board and a contactor, wherein a CTE ratio of a CTE of the signal distribution board to a CTE of the contactor is not equal to 1. The contactor may heat from a first contactor temperature to a second contactor temperature during testing of the microelectronic circuit, and the signal distribution board heats from a first signal distribution board temperature to a second signal distribution board temperature, and a temperature change ratio, being a difference between the second signal distribution board temperature and the first signal distribution board temperature to a difference between the second contactor temperature and the first contactor temperature, multiplied by the CTE ratio, is closer to 1 than the CTE ratio.

The coefficient of thermal expansion ratio multiplied by the temperature change ratio may be between 0.8 and 1.2.

The first component may be a substrate chuck having a surface supporting the substrate.

The tester apparatus may further include a pressure differential cavity seal between the first and second components, the pressure differential cavity seal forming an enclosed pressure differential cavity together with surfaces of the first and second components, and a pressure reduction passage within the pressure differential cavity through which air can be removed from the pressure differential cavity to move the first and second components relatively towards one another.

The pressure differential cavity seal may surround the contacts and the terminals.

The pressure differential cavity seal may be secured to the first component when the first and second components are apart.

The pressure differential cavity seal may be a lip seal.

A pressure reduction passage may be formed through one of the components, the pressure reduction passage having an inlet opening at the pressure differential cavity and an outlet opening outside the pressure differential cavity, and a first valve in the component having the pressure reduction passage, opening of the first valve allowing air out of the pressure differential cavity and closing of the valve keeping air from entering the pressure differential cavity.

The first valve may be a check valve, a vacuum release passage being formed through the component having the check valve, the vacuum release passage having an inlet opening at the pressure differential cavity and an outlet opening outside the pressure differential cavity, and a second, vacuum release valve in the component having the vacuum release passage, opening of the vacuum release valve allowing air into the pressure differential cavity and closing of the valve keeping air from escaping out of the pressure differential cavity.

The tester apparatus may further include a substrate suction passage in the first component, through which air can be pumped to reduce a pressure on a side of the substrate facing the first component to hold the substrate against the first component.

The contacts may be resiliently depressible by the terminals, further including a stand-off on the second component, the stand-off having a surface that limits depression of at least one of the contacts.

A plurality of separated stand-offs may be located between the contacts.

The tester apparatus may further include a layer having a first side that is adhesive and attached to the second component, and a second, opposite side that is adhesive, and the stand-off may be attached to the second side.

The first interface may include a plurality of lands and the second interface may include a plurality of members having contact surfaces that match with the lands and are resiliently depressible by the lands, allowing for movement relative to the structure of the stationary structure.

The lands and the terminals may be in parallel planes.

The stationary structure may include a thermal chuck, the portable supporting structure contacting the thermal chuck to allow for transfer of heat between the portable supporting structure and the thermal chuck.

A thermal interface cavity may be defined between the portable supporting structure and the thermal chuck, and a thermal interface vacuum passage may be formed through the thermal chuck to the thermal interface vacuum.

The tester apparatus may further include a thermal interface cavity seal contacting both the portable supporting structure and the thermal chuck, so that the thermal interface cavity seal defines the thermal interface cavity together with the portable supporting structure and the thermal chuck.

The tester apparatus may further include a thermal chuck on the stationary structure, the thermal chuck having a thermal control passage with an inlet, an outlet, and at least one section between the inlet and the outlet for a fluid to flow from the inlet to the outlet, heat transferring through the thermal chuck between the substrate and the fluid in the thermal control passage.

The thermal control passage may have first, second, and third sections in series after one another along a path of the fluid, and the third section may be located between the first and second sections in cross-sectional plan view.

The thermal control passage may have a fourth section in series after the third section along the path of the fluid, the fourth section being located between the second and third sections.

The thermal control passage may have a fourth section in series after the third section along the path of the fluid, the fourth section being located between the first and second sections.

The first, second, and third sections may be sections of a first spiral.

The first and second sections may be sections of a first spiral and the third section may be a section of a second spiral that is located on the first spiral.

The tester apparatus may further include a heater, heat being transferred to the fluid by the heater when the fluid is outside the thermal control passage.

The heater may be an electric heater.

Heat may be transferred from the substrate to the fluid that enters the fluid inlet at above 21 degrees Celsius.

Heat may be first transferred from the fluid to the substrate after the fluid enters the fluid inlet at above 21 degrees Celsius.

The fluid may have a temperature above 100 degrees Celsius when the fluid enters the fluid inlet.

The fluid may be recirculated.

The tester apparatus may further include at least one interface actuator having first and second actuator pieces that are actuable relative to one another to move the portable supporting structure relative to the stationary structure and engage the first interface with the second interface.

The first and second pieces may be a cylinder and a piston, respectively, the piston sliding along an internal surface of the cylinder.

The test that may be carried out on the microelectronic circuit by the tester may be a burn-in test.

The substrate may be a wafer with a plurality of microelectronic circuits.

The contacts may be pins, each pin having a spring that may be depressed against a spring force thereof when the respective contact is depressed by a respective one of the terminals.

The invention also relates to a method of testing a microelectronic circuit held by a substrate, including holding the substrate in a portable supporting structure having contacts against terminals of the substrate connected to the microelectronic circuit, receiving the portable supporting structure by a stationary structure with a first interface on the portable supporting structure connected to a second interface on the stationary structure, and transmitting signals between an electrical tester and the microelectronic circuit through the terminals, contacts, and first and second interfaces to test the microelectronic circuit.

The substrate may be held between first and second components of the portable supporting structure and the contacts may be on the second component, further including moving the first and second components relatively towards one another to ensure proper contact between the contacts and the terminals.

The portable supporting structure together with the substrate may include first and second elements, wherein a CTE ratio of a CTE of the first element to a CTE of the second element is not equal to 1.

The CTE ratio multiplied by the temperature change ratio is preferably between 0.8 and 1.2.

The first and second elements may be a signal distribution board and a contactor on the same side of the substrate.

One of the elements is the substrate

The first component may be a substrate chuck having a surface supporting the substrate.

The method may further include locating a pressure differential cavity seal between the first and second components to form an enclosed cavity by surfaces of the first and second components and the pressure differential cavity seal, and reducing a pressure within the pressure differential cavity seal cavity to move the first and second components relatively towards one another.

The pressure differential cavity seal may surround the contacts and the terminals.

The pressure differential cavity seal may be secured to the first component when the first and second components are apart.

The substrate cavity seal may be created with a lip seal.

A pressure reduction passage may be formed through one of the components, the pressure reduction passage having an inlet opening at the pressure differential cavity and an outlet opening outside the pressure differential cavity, and a first valve in the component having the pressure reduction passage, further including opening of the first valve to allow air out of the pressure differential cavity, and closing the first valve, keeping air from entering the pressure differential cavity.

The first valve may be a check valve, a vacuum release passage being formed through the component having the check valve, the vacuum release passage having an inlet opening at the pressure differential cavity and an outlet opening outside the pressure differential cavity, and a second, vacuum release valve in the component having the vacuum release passage, further including: opening of the vacuum release valve to allow air into the pressure differential cavity, and closing of the valve, keeping air from escaping out of the pressure differential cavity.

A pressure within the pressure differential cavity may be created before the portable supporting structure is received by the stationary structure.

The method may further include pumping air through a substrate suction passage in the first component to reduce a pressure on a side of the substrate facing the first component and holding the substrate against the first component.

The contacts may be resiliently depressible by the terminals, further including limiting depression of at least one of the contacts with a surface of a stand-off on the second component.

A plurality of separated stand-offs may be located between the contacts.

The method may further include a layer having a first side that is adhesive and attached to the second component and a second, opposite side that is adhesive, and the stand-off may be attached to the second side.

The method may further include locating lands of a first interface on the portable supporting structure against a plurality of matching members of a second interface on the stationary structure, and resiliently depressing the members with the lands.

The method may further include locating a surface of the portable supporting structure against a surface of a thermal chuck on the stationary structure, and transferring heat through the surfaces.

The method may further include reducing a pressure of air in a thermal interface cavity defined between the surfaces of the portable supporting structure and the thermal chuck.

A thermal interface cavity may be defined between the portable supporting structure and the thermal chuck, and a thermal interface vacuum passage may be formed through the thermal chuck to the thermal interface vacuum.

The method may further include locating a thermal interface cavity seal between the portable supporting structure and the thermal chuck so that the thermal interface cavity may be defined by the thermal interface cavity seal together with the portable supporting structure and the thermal chuck.

The method may further include passing a fluid from a fluid inlet to a fluid outlet through at least one section of a thermal control passage in a thermal chuck on the stationary structure, and transferring heat between the fluid in the thermal control passage and the substrate to control a temperature of the substrate.

The thermal control passage may have first, second, and third sections in series after one another along a path of the fluid, and the third section may be located between the first and second sections in cross-sectional plan view.

The thermal control passage may have a fourth section in series after the third section along the path of the fluid, the fourth section being located between the second and third sections.

A temperature of the thermal chuck between the second and third sections may be between a temperature of the fluid in the first and second sections, and a temperature of the thermal chuck between the first and fourth sections may be between a temperature of the fluid in the first and second sections.

There may be a larger temperature difference between the fluid in the first and fourth sections than between the fluid in the second and third sections.

The thermal control passage may have a fourth section in series after the third section along the path of the fluid, the fourth section being located between the first and second sections.

The first, second, and third sections may be sections of a first spiral.

The first and second sections may be sections of a first spiral and the third section may be a section of a second spiral that may not be located on the first spiral.

The fluid may have a temperature above 21 degrees Celsius when the fluid enters the fluid inlet.

Heat may be transferred from the substrate to the fluid that enters the fluid inlet at above 21 degrees Celsius.

Heat may be first transferred from the fluid to the substrate after the fluid enters the fluid inlet at above 100 degrees Celsius.

The fluid may be recirculated.

The test that is carried out on the microelectronic circuit may be a burn-in test.

The substrate may be a wafer with a plurality of microelectronic circuits.

The contacts may be pins, each pin having a spring that may be depressed against a spring force thereof when the respective contact may be depressed by a respective one of the terminals.

The invention further provides a thermal control apparatus, including a thermal chuck having a thermal control passage with an inlet, an outlet, and at least first, second, and third sections in series after one another along a path of the fluid from the fluid inlet to the fluid outlet, and the third section is located between the first and second sections in cross-sectional plan view.

The thermal control passage may have a fourth section in series after the third section along the path of the fluid, the fourth section being located between the second and third sections.

The thermal control passage may have a fourth section in series after the third section along the path of the fluid, the fourth section being located between the first and second sections.

The first, second, and third sections may be sections of a first spiral.

The first and second sections may be sections of a first spiral, and the third section may be a section of a second spiral that is not located on the first spiral.

The invention further relates to electrical aspects of a tester apparatus including an electrical tester for connection through the contacts to a plurality of terminals of at least one substrate carrying at least one integrated circuit and having the terminals connected to the integrated circuit so that current conducts between the electrical tester and the integrated circuit to test the integrated circuit.

The tester apparatus may further include a power supply circuit connected to the contacts, wherein power is provided through the power supply circuit connected to the contacts.

There may be a plurality of n plus one power supply circuits connected to one another in parallel such that power is provided to the integrated circuit by n plus one of the power supply circuits, and if one of the power supplies fails, power is still provided to the integrated circuit by n of the circuits.

The tester apparatus may further include a current-sharing circuit that (i) detects at least a reduction in power of one of the n plus one power supply circuits and (ii) switching a connection from the one of the n plus one power supply circuits off to eliminate current from the one of the n plus one power supply circuits so that current is shared by the n power supply circuits.

The current-sharing circuit may include a plurality of fault-detection circuits, each detecting power loss from a respective one of the power supply circuits.

The tester apparatus may further include a power supply control circuit powered from at least one of a plurality of power supply circuits, the power supply control circuit switching the power supply circuits between a test mode wherein power is provided by a first number of the plurality of power supply circuits, and a power-save mode wherein power is provided by a second number of the power supply circuits, the second number being less than the first number.

The tester apparatus may further include a current configuration circuit that is configurable to switch current switching between a first configuration wherein separate current at different magnitudes is provided to separate channels, and a second configuration wherein currents to separate channels follow a common reference.

The current configuration circuit may include a plurality of current amplifiers, each current amplifier having output current that follows a separate reference when the current configuration circuit is in the first configuration.

The tester apparatus may further include a current amplifier that amplifies current to separate channels.

The tester apparatus may further include signal electronics that provide signals to the integrated circuit.

The tester apparatus may further include a supporting structure for holding the at least one substrate, and a plurality of contacts matching the terminals for making contact to the terminals, the electrical tester being connected through the contacts to the terminals so that current conducts between the electrical tester and the integrated circuit to test the integrated circuit.

The invention also relates to electrical aspects of a method of testing at least one circuit held by at least one substrate, including locating contacts against terminals of the substrate connected to the integrated circuit, and conducting current between an electrical tester and the integrated circuit through the terminals and contacts to test the integrated circuit.

Power may be provided through a power supply circuit connected to the contacts.

There may be a plurality of n plus one power supply circuits connected to one another in parallel such that power may be provided to the integrated circuit of the at least one substrate by n plus one of the power supply circuits, still providing current to the integrated circuit by n of the circuits upon failure of one of the power supply circuits.

The method may further include detecting at least a reduction in power of one of the n plus one power supply circuits, and switching a connection from the one of the n plus one power supply circuits off to eliminate current from the one of the n plus one power supply circuits so that current may be shared by the n power supply circuits.

The method may further include detecting power loss from each one of the power supply circuits with a separate fault-detection circuit.

The method may further include providing power from at least one of a plurality of power supply circuits to a power supply control circuit, and utilizing the power supply control circuit to switch between a test mode wherein power may be provided by a first number of the plurality of power supply circuits, and a power save mode wherein power may be provided by a second number of the power supply circuits, the second number being less than the first number.

The method may further include switching between a first configuration wherein separate current at different magnitudes may be provided to separate channels, and a second configuration wherein currents to separate channels follow a common reference.

The current configuration circuit may include a plurality of current amplifiers, each current amplifier having output current that follows a separate reference, the current configuration circuit being in the first configuration.

The method may further include amplifying current to separate channels.

The method may further include providing signals to the integrated circuit.

BRIEF DESCRIPTION OF THE DRAWINGS

The invention is further described by way of example with reference to the accompanying drawings wherein.

DETAILED DESCRIPTION OF THE INVENTION

Figure 1:
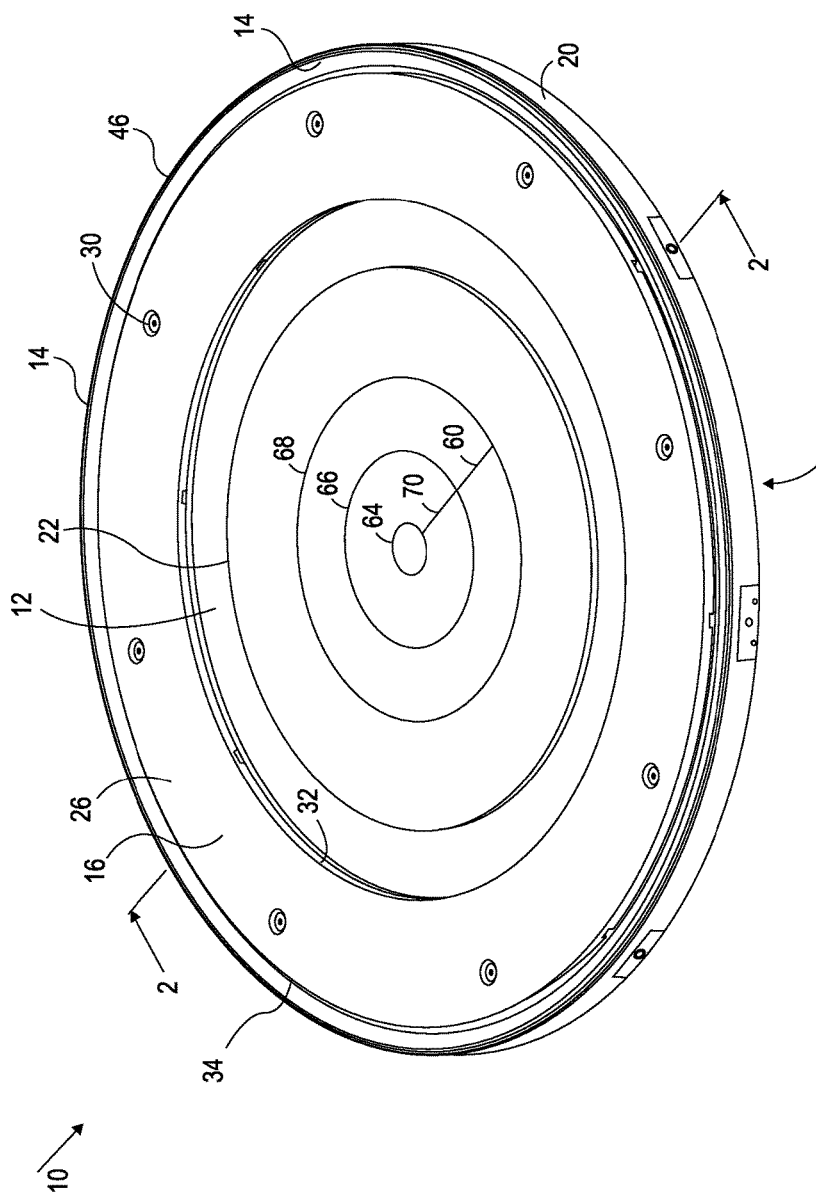
FIG. 1 is a perspective view of wafer chuck assembly.
Figure 2:
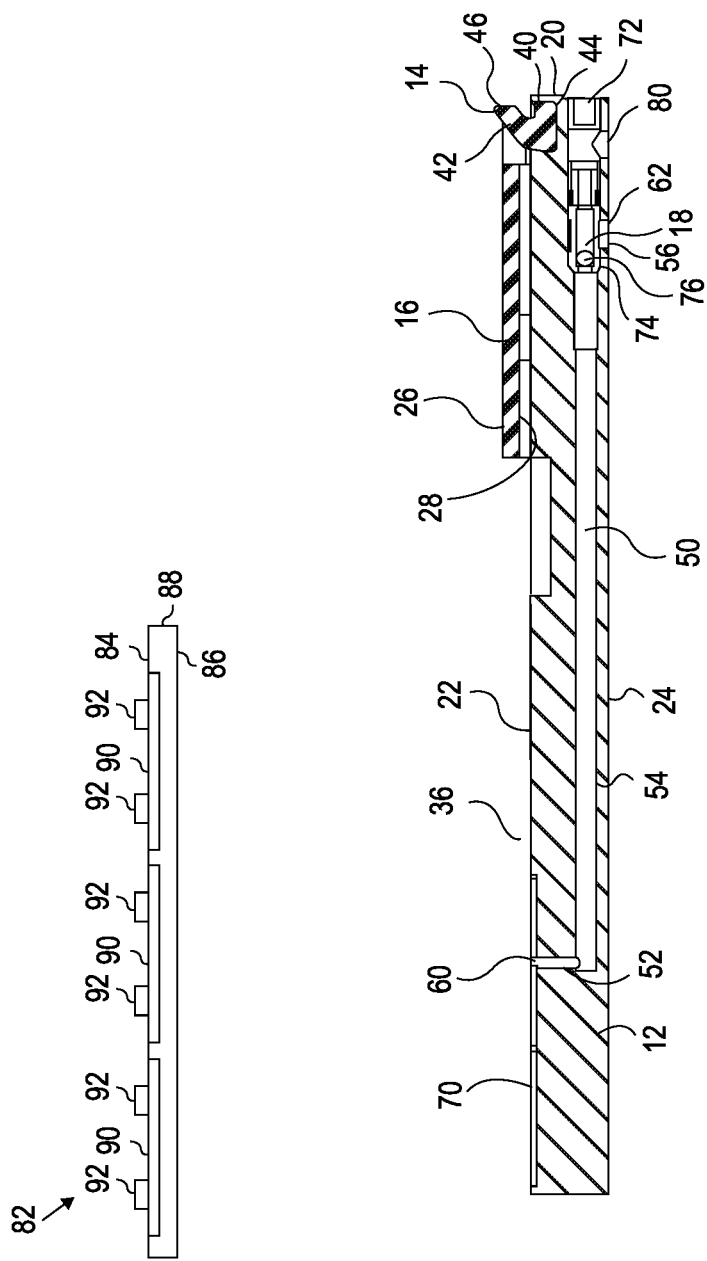
FIG. 2 is a cross-sectional side view on 2-2 in FIG. 1 of a portion of the wafer chuck assembly and a portion of a wafer substrate, wherein vertical dimensions of the wafer substrate are exaggerated for purposes of illustration.

FIG. 1 of the accompanying drawings illustrates a wafer chuck assembly 10 in perspective view, and FIG. 2 illustrates a portion of the wafer chuck assembly 10 in cross-sectional side view. The wafer chuck assembly 10 includes a wafer chuck component 12, a pressure differential substrate cavity seal 14, an offset ring 16, and a substrate suction passage valve 18.

The wafer chuck component 12 is made of aluminum or another metal having relatively high thermal conductivity and has a predetermined, relatively low coefficient of thermal expansion. The wafer chuck component 12 has a circular outer surface 20 and upper and lower surfaces 22 and 24. The diameter of the outer surface 20 is typically between 350 and 450 mm, more typically approximately 400 mm. The upper surface 22 has a number of grooves formed therein and extends up to the outer surface 20. The lower surface 24 is also formed in a single plane that extends up to the outer surface 20. The planes of the upper and lower surfaces 22 and 24 are parallel to one another. The lower surface 24 has the same surface area as the upper surface 22.

The offset ring 16 has an upper surface 26 and a lower surface 28. The lower surface 28 of the offset ring 16 is positioned on top of the upper surface 22 of the wafer chuck component 12, and the offset ring 16 is secured to the wafer chuck component 12 with fasteners 30. The upper surface 26 of the offset ring 16 is thus in a plane that is vertically spaced from the plane of the upper surface 22 of the wafer chuck component 12.

The offset ring 16 also has inner and outer surfaces 32 and 34. The inner surface 32 together with a central portion of the upper surface 22 of the wafer chuck component 12 define a circular recess 36 for receiving a wafer having a circular outer edge. In the illustration provided, the wafer would have a diameter of approximately 200 mm. Larger wafers can be accommodated by removing the offset ring 16.

The substrate cavity seal 14 is formed into a closed circular loop that entirely surrounds the offset ring 16 and the recess 36 for the wafer. The substrate cavity seal 14 is a lip seal having a lower anchor portion 40 and an upper lip 42. The lower anchor portion 40 is secured within a groove formed in an outer region of the upper surface 22 of the wafer chuck component 12. The lower anchor portion 40 anchors within the groove due to thermo-elastic properties of the substrate cavity seal 14. The lip 42 has an upper surface 46 in a plane that is vertically spaced from the plane of the upper surface 26 of the offset ring 16. The upper surface 46 of the lip 42 is resiliently depressible in a direction towards the wafer chuck component 12. A pressure that is applied to the upper surface 46 bends the lip 42 so that the upper surface 46 moves in a downward direction, and the upper surface 46 moves in an upward direction due to resiliency of the lip 42 when the pressure is removed.

A substrate suction passage 50 is formed within the wafer chuck component 12. The substrate suction passage 50 includes first, second, and third portions 52, 54, and 56. The first portion 52 is drilled from the outer surface towards a center of the wafer chuck component 12. The second portion 54 has a length that is approximately one-third of a diameter of the outer surface 20 of the wafer chuck component 12. The first portion 52 is drilled from the upper surface 22 of the wafer chuck component 12, the first portion 52 forming an air inlet opening 60 at the upper surface 22 of the wafer chuck component 12. The third portion 56 is drilled from the lower surface 24 of the wafer chuck component 12, near a periphery of the lower surface 24, to the second portion 54. The third portion 56 forms an air outlet opening 62 at the lower surface 24.

Three circular grooves 64, 66, and 68 and a slot 70 are formed in the upper surface 22 of the wafer chuck component 12. The circular grooves 64, 66, and 68 are concentric with center points that coincide with a center point of the outer surface 20 of the wafer chuck component 12. The slot 70 is formed to the same depth as the circular grooves 64, 66, and 68 and connects the circular grooves 64, 66, and 68 with one another. The air inlet opening 60 is located within the slot 70 between the circular grooves 66 and 68.

The substrate suction passage valve 18 is a shuttle valve that is inserted from the outer surface 20 of the wafer chuck component 12 into the second portion 54 of the substrate suction passage 50, and the second portion 54 of the substrate suction passage is then closed with a plug 72. The substrate suction passage valve 18 has a seat 74 and a ball valve component 76. When a pressure at the air outlet opening 62 is lower than a pressure at the air inlet opening 60, the ball valve component 76 lifts off the seat 74 to allow air to flow from the air inlet opening 60 to the air outlet opening 62. The ball valve component 76 rests on the seat 74 when the pressure at the air inlet opening 60 is lower than at the air outlet opening 62, thereby preventing air from flowing from the air outlet opening 62 to the air inlet opening 60.

A pressure release opening 80 is formed into the lower surface 24 of the wafer chuck component 12, and connects with the second portion 54 of the substrate suction passage 50 on a side of the substrate suction passage valve 18 opposing the air inlet opening 60. In a situation where the pressure at the air inlet opening 60 is lower than at the air outlet opening 62, and the ball valve component 76 rests on the seat 74, a pressure at the release opening 80 can be reduced to below the tip pressure at the air inlet opening 60 so that the ball valve component 76 lifts off the seat 74. When the ball valve component 76 lifts off the seat 74, air flows from the air inlet opening 60 past the ball valve component 76 to the air outlet opening 62.

FIG. 2 further illustrates a wafer substrate 82 before it is inserted in the wafer chuck assembly 10. Vertical dimensions of the wafer substrate 82 are enlarged for purposes of illustration. The wafer substrate 82 has an upper surface 84, a parallel lower surface 86, and a circular edge 88. The wafer substrate 82 also includes a plurality of integrated microelectronic circuits 90 formed below the upper surface 84 and spaced from the lower surface 86. Each integrated microelectronic circuit 90 includes a plurality of electronic components such as capacitors, diodes, and/or transistors that are interconnected with one another using metal lines, plugs, and vias. The wafer substrate 82 also has a plurality of metal terminals 92 at the upper surface 84. In the present example, the terminals 92 have upper surfaces that form a plane that is slightly above the upper surface 84. In the present example, therefore, the total thickness of the wafer substrate 82 is measured from the lower surface 86 to an upper surface of one of the terminals 92. Each one of the integrated microelectronic circuits 90 has a plurality of the terminals 92 connected thereto.

In use, the air inlet opening 60 and the release opening 80 are held at ambient pressure. The wafer substrate 82 is then located within the recess 36. The lower surface 86 of the wafer substrate 82 is positioned on top of the upper surface 22 of the wafer chuck component 12. An edge 88 of the wafer substrate 82 fits within the inner surface 32 of the offset ring 16.

A small enclosed space is defined between the slot 70 and the lower surface 86. With reference to FIGS. 1 and 2, the enclosed space extends to the circular grooves 64, 66, and 68, which are closed by the lower surface 86 of the wafer substrate 82 from the top. A pump is connected to the air outlet opening 62 and is used to reduce the pressure at the air outlet opening 62 to below ambient pressure. The pressure at the air outlet opening 62 is then below the pressure at the air inlet opening 60, so that the ball valve component 76 lifts off the seat 74. A small amount of air is pumped out of the enclosed cavity defined by the circular grooves 64, 66, 68 and the slot 70 through the substrate suction passage 50, through the substrate suction passage valve 18, and out of the air outlet opening 62. The enclosed cavity defined by the circular grooves 64, 66, and 68 and the slot 70 is then at below ambient pressure. The upper surface 84 of the wafer substrate 82 is at ambient pressure. The lower pressure on the lower surface 86 than at the upper surface 84 of the wafer substrate 82 holds the lower surface 86 of the wafer substrate 82 against the upper surface 22 of the wafer chuck component 12. Alignment of the wafer substrate 82, and in particular of the terminals 92 relative to the wafer chuck assembly 10, is maintained by holding the wafer substrate 82 against the upper surface 22 of the wafer chuck component 12.

The air outlet opening 62 can then again be brought to ambient pressure. Because the air inlet opening 60 is still at below ambient pressure, the ball valve component 76 remains on the seat 74 even after the air outlet opening 62 returns to ambient pressure. Should it at any time become necessary to remove the wafer substrate 82 from the wafer chuck assembly 10, the release opening 80 can be brought to a pressure that is below the pressure of the air inlet opening 60. The air inlet opening 60 is then at a higher pressure than the release opening 80, so that the ball valve component 76 lifts off the seat 74. The air inlet opening 60 is then connected to the air outlet opening and a small amount of air flows from the air outlet opening to the air inlet opening 60 and into the circular grooves 64, 66, and 68 and into the slot 70. The lower surface 86 of the wafer substrate 82 is thereby brought to ambient pressure, and thus to the same pressure as the upper surface 84 of the wafer substrate 82. The wafer substrate 82 can then be removed from the wafer chuck assembly 10.

Figure 3:
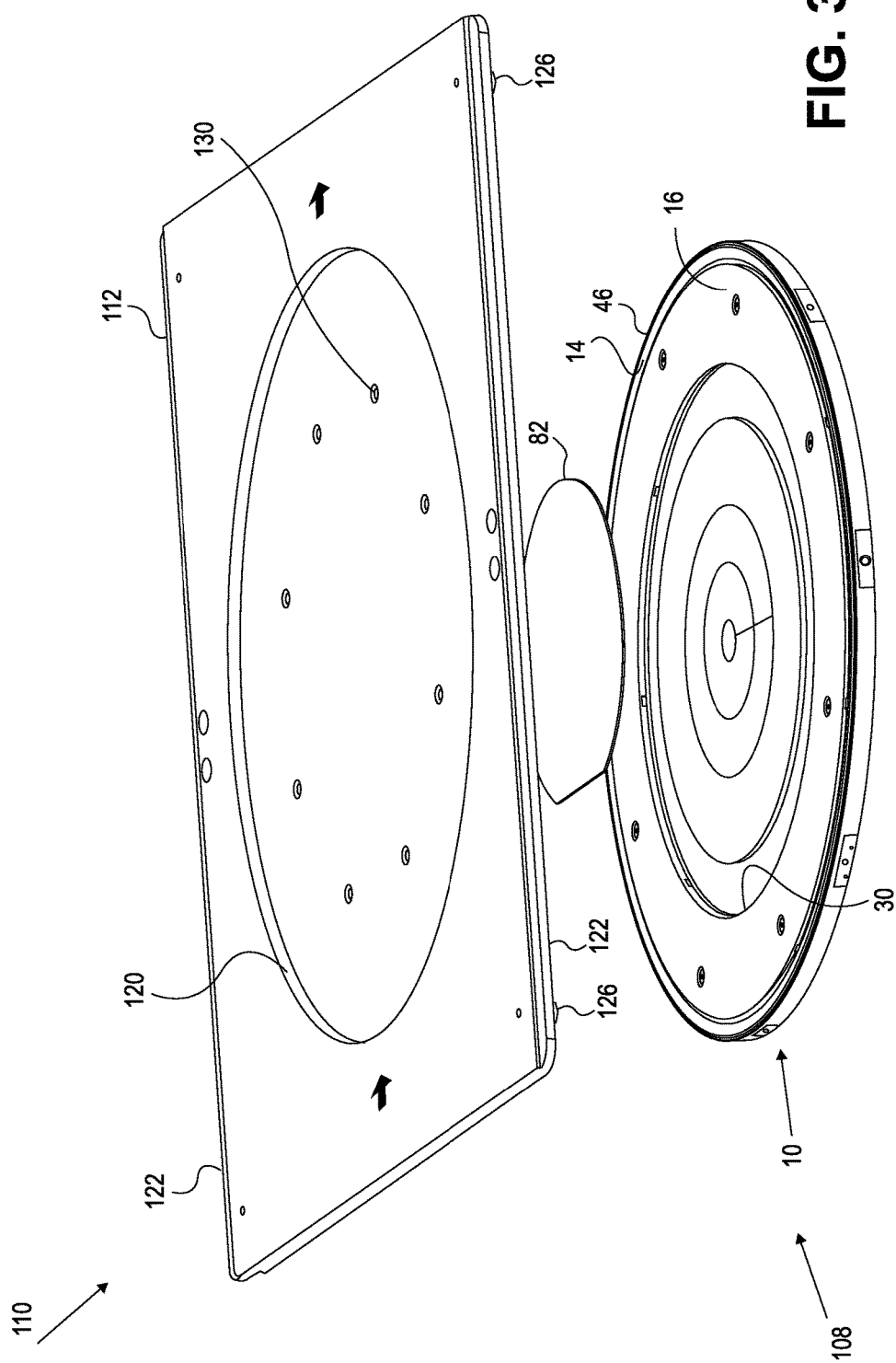
FIG. 3 is a perspective view of a portable pack, according to an embodiment of the invention, which includes the wafer chuck assembly and distribution board assembly.
Figure 4:
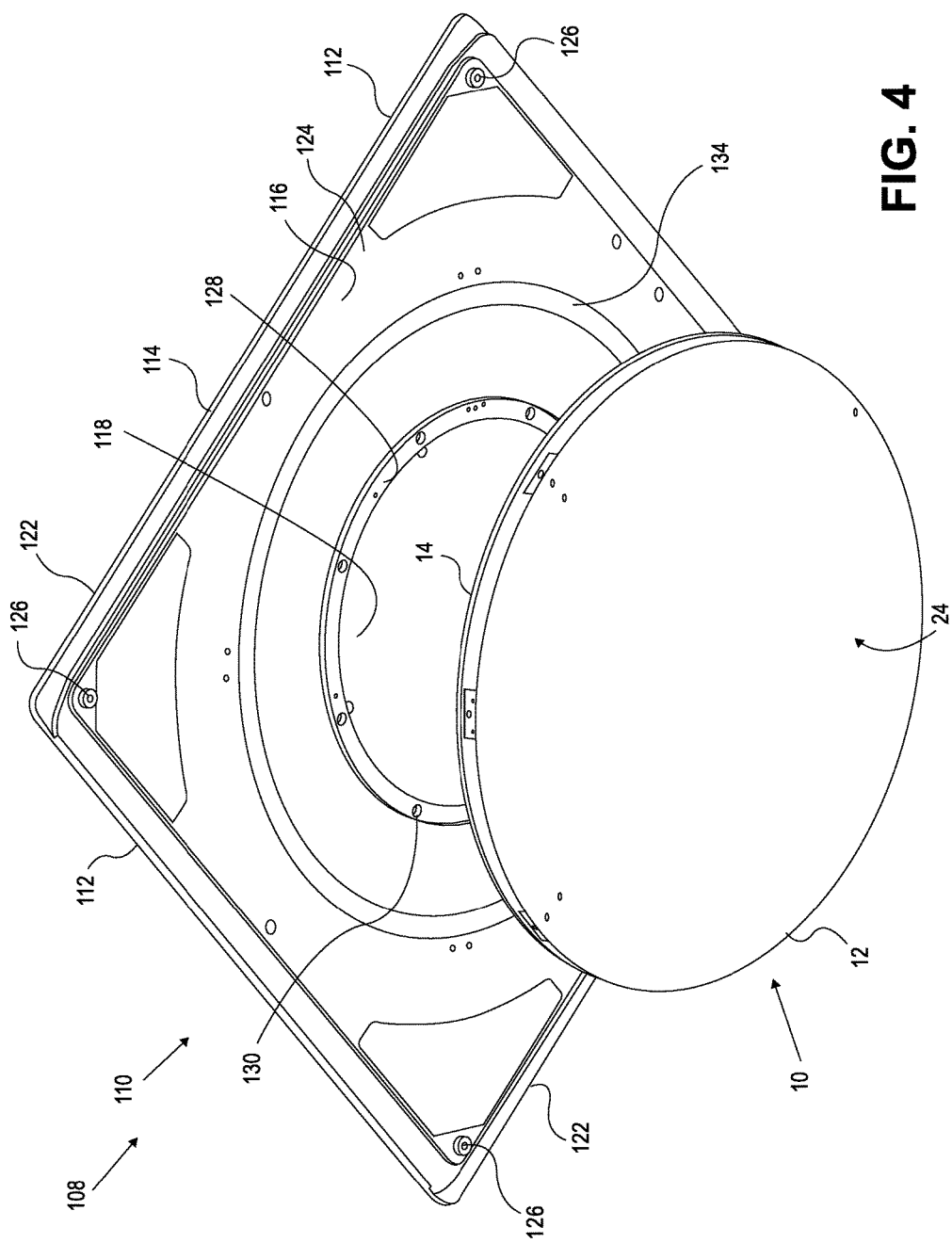
FIG. 4 is a perspective view from below the portable pack.

FIGS. 3 and 4 illustrate a portable pack 108 for holding the wafer substrate 82, including the wafer chuck assembly 10 and a distribution board assembly 110. FIGS. 3 and 4 do not illustrate electrical paths, including contacts, interfaces and vias, of the distribution board assembly 110 in detail. As such, only a structural component of the distribution board assembly 110 is illustrated. The structural component includes a metal backing plate 114, a signal distribution board 116, and a backing member 118 of a contactor.

The metal backing plate 114 has a substantially square shape. A circular opening 120 is formed within the metal backing plate 114. Two opposing edges 122 of the metal backing plate 114 are machined down so that the rest of the metal backing plate 114 is slightly thicker than the opposing edges 122, and each opposing edge 122 defines a respective flange.

The signal distribution board 116 includes a substrate 124 having a substantially square shape that is slightly smaller than the metal backing plate 114. The signal distribution board 116 is positioned between the flanges defined by the opposing edges 122, and fasteners 126 are used to secure the substrate 124 to the metal backing plate 114.

The backing member 118 of the contactor is circular and is positioned centrally on the substrate 124 opposing the signal distribution board 116. A clamp ring 128 is positioned over an edge of the backing member 118. Fasteners 130 are used to secure the clamp ring to the substrate 124 of the signal distribution board 116. The clamp ring 128 has an outer edge that is larger than the backing member 118 of the contactor and an inner edge that is slightly smaller than the backing member 118 of the contactor. Because of the dimensions of the clamp ring 128, the clamp ring 128 secures the backing member 118 of the contactor to the substrate 124 of the signal distribution board 116. The clamp ring 128 has an outer diameter that is slightly smaller than the diameter of the inner surface 32 of the offset ring 16 of the wafer chuck assembly 10.

The signal distribution board 116 further has a gold metal seat 134 on the substrate 124. The gold metal seat 134 is in the form of a ring having inner and outer diameters that are respectively slightly smaller and slightly larger than a diameter of the upper surface 46 of the substrate cavity seal 14.

The components of the distribution board assembly 110 all have similar, relatively high coefficients of thermal expansion.

Figure 5:
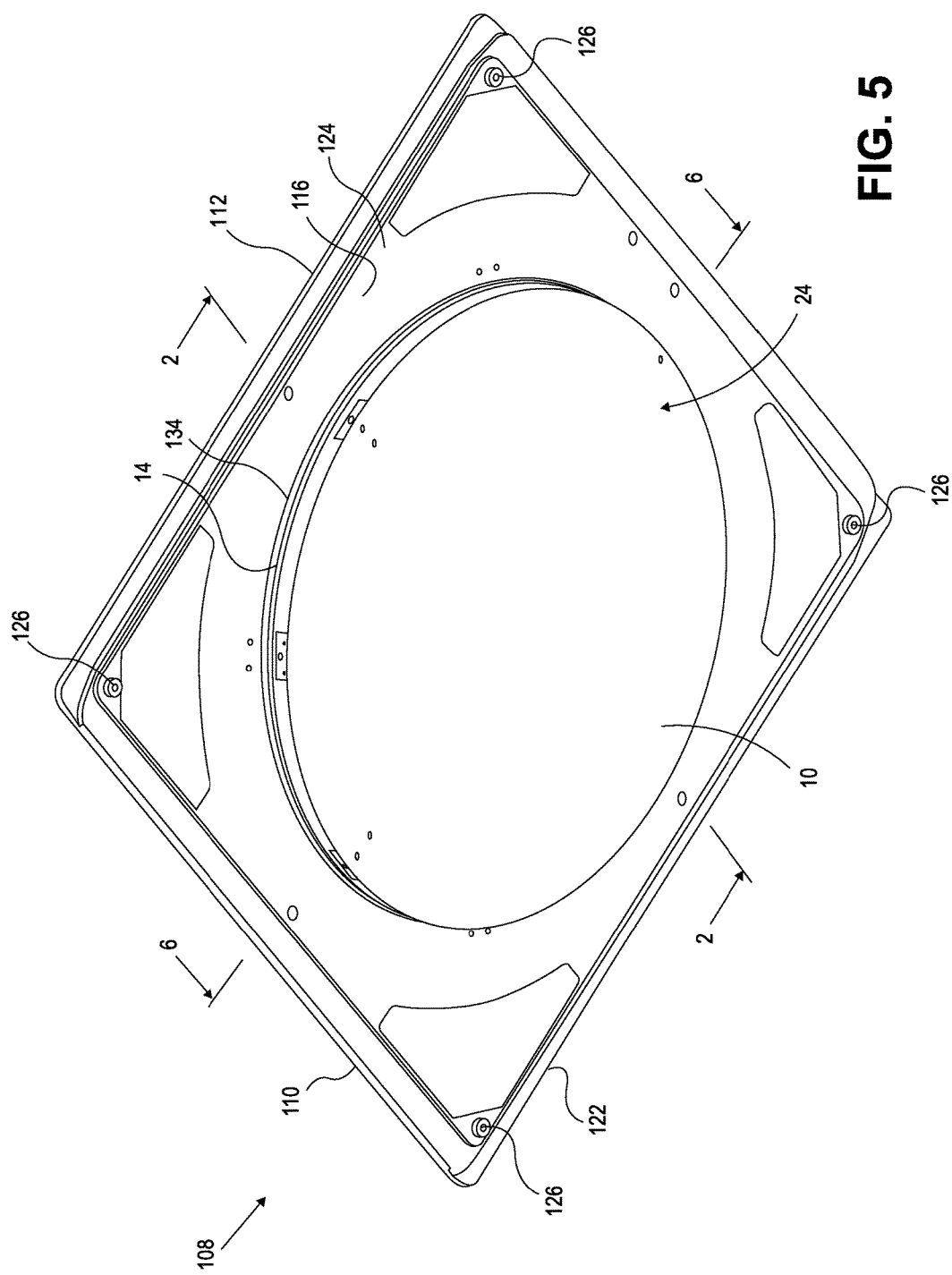
FIG. 5 is a view similar to FIG. 4 after the portable pack is assembled.

FIG. 5 illustrates the portable pack 108 after the distribution board assembly 110 is positioned on top of the wafer chuck assembly 10. The gold metal seat 134 is located at the bottom of the distribution board assembly 110 and is positioned on top of the substrate cavity seal 14 located at the top of the wafer chuck assembly 10.

Figure 6:
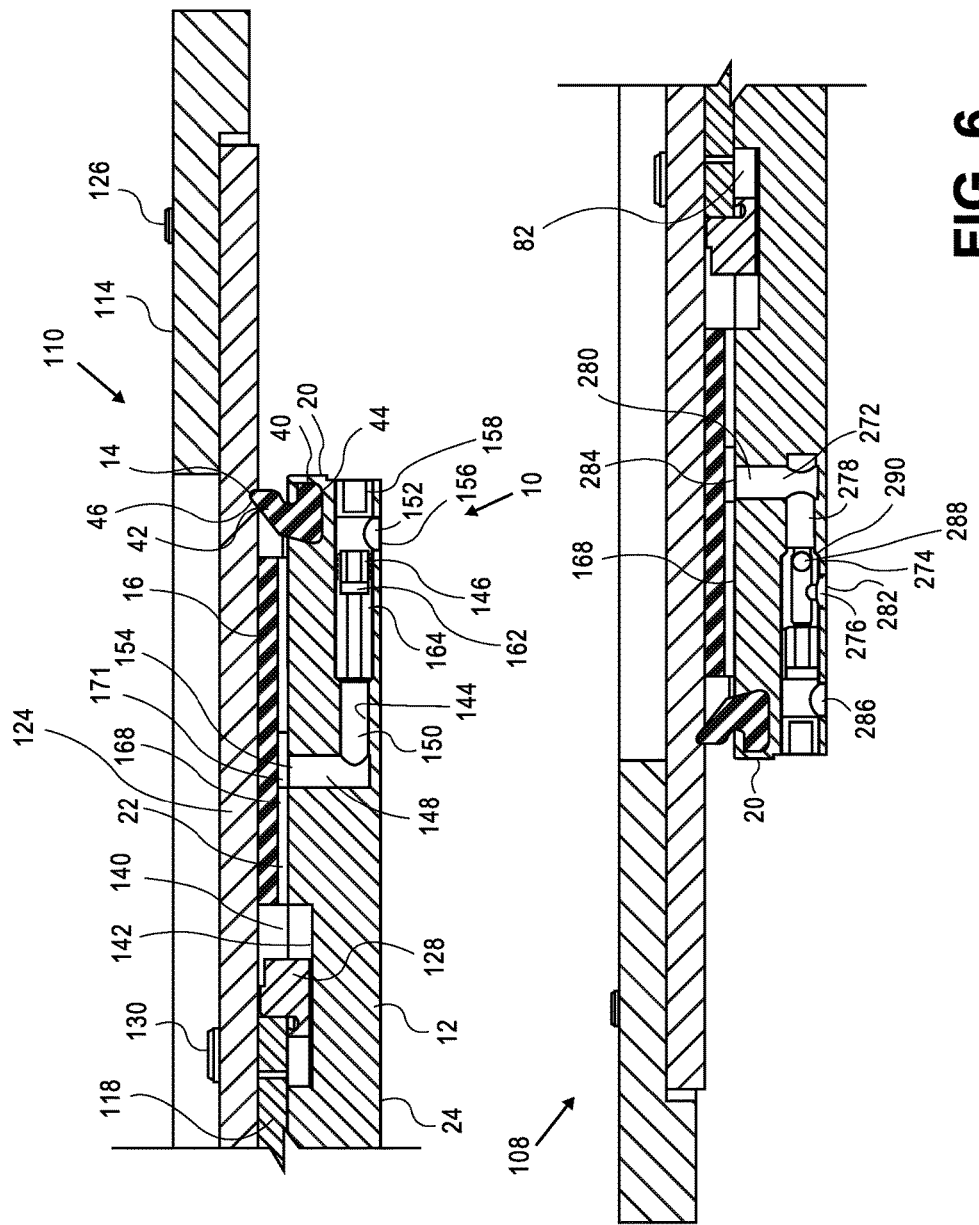
FIG. 6 is a cross-sectional side view on 6-6 in FIG. 5 of the portable pack.

Referring now to FIG. 6, the substrate cavity seal 14 is located between the wafer chuck component 12 at the bottom and the substrate 124 of the signal distribution board 116 at the top. The wafer chuck component 12, the substrate cavity seal 14, and the substrate 124 of the signal distribution board 116 jointly define an enclosed pressure differential cavity 140. The pressure differential cavity 140 extends to a space between the wafer substrate 82 and the backing member 118 of the contactor. Before the lip 42 of the substrate cavity seal 14 is deflected, the pressure differential cavity 140 also extends to a space between the offset ring 16 of the wafer chuck assembly 10 and the substrate 124 of the signal distribution board 116. The pressure differential cavity 140 also extends into a circular groove 142 formed on the upper surface 22 of the wafer chuck component 12, and a raised portion of the clamp ring 128 is positioned within the groove 142. A small space is provided between a lower surface of the clamp ring 128 and an upper surface of the groove 142 to allow for communication between inner and outer volumes of the pressure differential cavity 140 within and outside of the clamp ring 128.

A pressure reduction passage 144 is formed within the wafer chuck component 12, and a pressure reduction passage check valve 146 is located within the pressure reduction passage 144. The pressure reduction passage 144 includes first, second, and third portions 148, 150, and 152. The first portion 148 is drilled from the upper surface 22 of the wafer chuck component 12 and forms an inlet opening 154 at the upper surface 22. The third portion 152 is drilled from the lower surface 24 of the wafer chuck component 12 and forms an outlet opening 156 at the lower surface 24. The second portion 150 is drilled from the outer surface 20 of the wafer chuck component 12 and connects the first and second portions 148 and 150 to one another. The pressure reduction passage check valve 146 is inserted from the outer surface 20 of the wafer chuck component 12 into the second portion 150, and a plug 158 is used to close an entry of the second portion 150 at the outer surface 20.

The pressure reduction passage check valve has a valve component 162 and a seat 164. The valve component 162 lifts off the seat 164 when air flows from the inlet opening 154 to the outlet opening 156. Air is prevented from flowing from the outlet opening 156 to the inlet opening 154 because the valve component 162 rests on the seat 164.

The offset ring 16 has a plurality of slots 168 formed in a lower side thereof. One of the slots 168 is shown in cross-section in FIG. 6 and connects the inlet opening 154 of the pressure reduction passage 144 to the pressure differential cavity 140. Further slots 168 extend radially towards a center of the offset ring 16 and are also connected to the inlet opening 154 of the pressure reduction passage 144 with a circular groove 142 in a lower side of the offset ring 16.

In use, the pressure differential cavity 140 is initially at ambient pressure, and the outlet opening 156 is connected to a pump so that the outlet opening 156 is at below ambient pressure. A pressure differential is thus created between the air inlet opening 154 and the outlet opening 156 so that air is pumped from the pressure differential cavity 140 through the pressure reduction passage check valve 146 in the pressure reduction passage 144. The pressure within the pressure differential cavity 140 drops to below ambient pressure. A pressure outside of the portable pack 108 remains at ambient pressure, so that a pressure differential is created wherein the pressure within the pressure differential cavity 140 is lower than a pressure above the substrate 124 of the signal distribution board 116 and a pressure below the lower surface 24 of the wafer chuck component 12. The pressure differential causes deflection of the lip 42 of the substrate cavity seal 14 and a reduction in a vertical height of the pressure differential cavity 140.

The vertical height of the pressure differential cavity 140 continues to decrease until a lower surface of the substrate 124 of the signal distribution board 116 comes into contact with an upper surface of the offset ring 16. The offset ring 16 thus limits movement of the substrate 124 of the signal distribution board 116 and the wafer chuck component 12 relatively towards one another.

The outlet opening 156 can then again be brought to ambient pressure and can be disconnected from the pump. The valve component 162 rests on the seat 164, and prevents air from entering into the pressure differential cavity 140 through the pressure reduction passage 144. The pressure differential cavity 140 thereby maintains its reduced size, wherein the substrate 124 of the signal distribution board 116 contacts the offset ring 16. The portable pack 108 can then be removed from any apparatus that is used to connect a pump to the outlet opening 156 and reduce the pressure within the pressure differential cavity 140 and can be transported to a tester at the subsystem.

Figure 7:
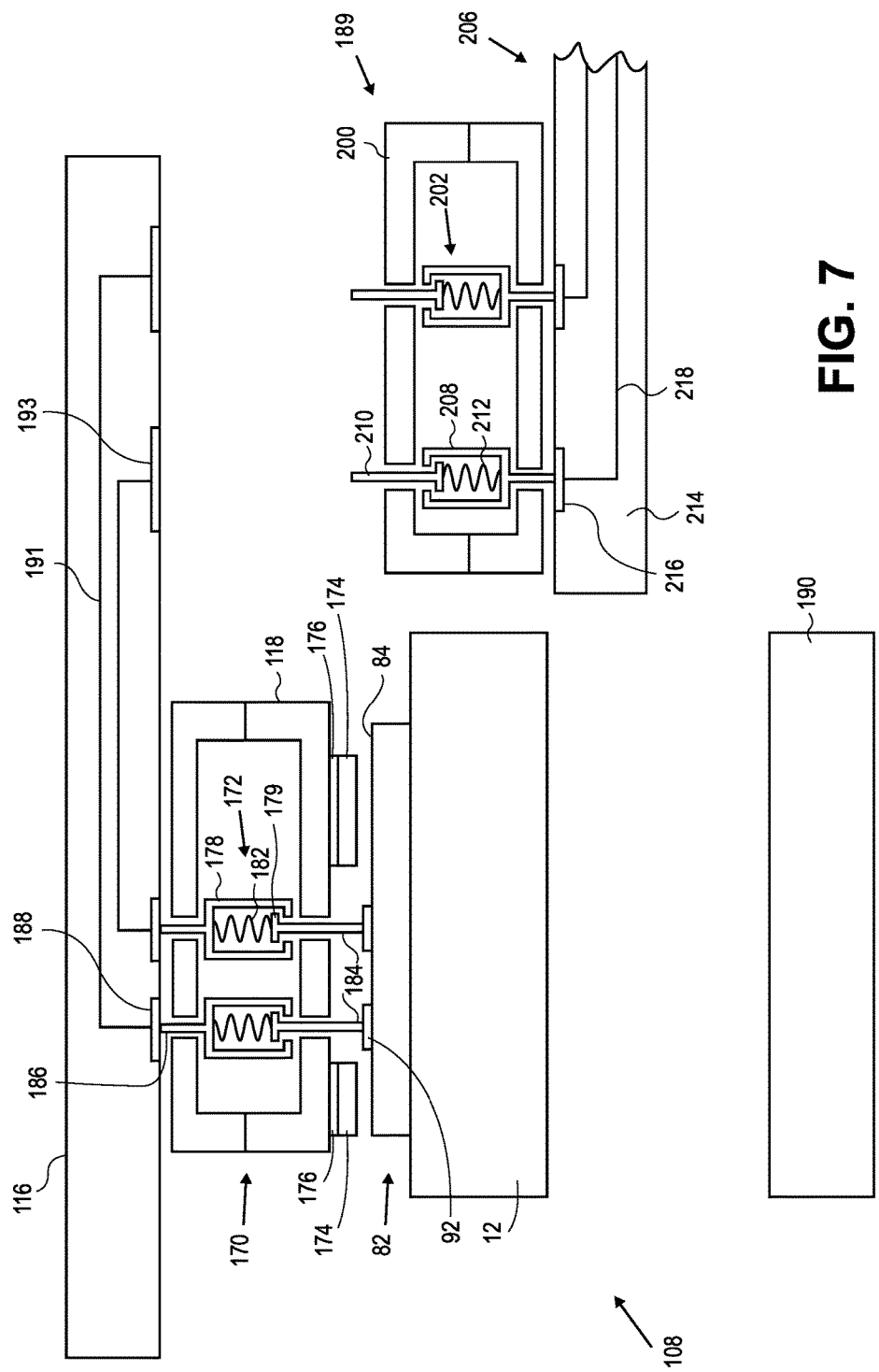
FIG. 7 is a cross-sectional side view of the portable pack and components of a stationary structure, including a signal distribution board, a contactor, and a thermal chuck, illustrating primarily electrical detail.

As shown in FIG. 7, the backing member 118 forms part of a contactor 170, and the contactor 170 further includes a plurality of pins 172, stand-offs 174, and adhesive 176.

Each one of the pins 172 has first and second components 178 and 179 and a respective spring 182. The first component 178 has a cavity therein and the spring 182 is located in the cavity. A portion of the second component 179 is also located within the cavity holding the spring 182. The first and second components 178 and 179 are mounted to one another and can move relative to one another. Movement of a terminal of the second component 179 relatively towards a terminal of the first component 178 compresses the spring 182. Movement of the terminals of the first and second components 178 and 179 towards one another thus requires a force to overcome a spring force of the spring 182. The force ensures proper contact between the pins 172 and the terminals 92 of the wafer substrate 82. When the force is removed, the terminals of the first and second components 178 and 179 move away from one another due to a spring force of the spring 182. In an alternative embodiment, a spring force can be created by a component such as a membrane or another spring that is not a coil spring.

The backing member 118 is formed into two halves, and each half has a respective set of openings formed therein. One of the terminals of one of the pins 172 is inserted through one opening in one of the halves of the backing member 118, and the other terminal of the pin 172 is inserted through one of the openings in the other half of the backing member 118. The terminals of each pin 172 are inserted through a respective pair of openings in the two halves of the backing member 118. The pins 172 are retained within the backing member 118 when the halves of the backing member 118 are secured to one another. The terminals of the pins 172 form a respective array of contacts 184 at the bottom of the contactor 170 and a corresponding array of contacts 186 at the top of the contactor 170.

The signal distribution board 116, in addition to the substrate 124, further includes a plurality of contacts 188, a plurality of lands 193, and a plurality of metal lines 191. The contacts 188 and the lands 193 are located on the same side of the substrate 124. The contacts 188 are within the substrate cavity seal 14 shown in FIG. 4, and the lands 193 are outside the substrate cavity seal 14. Each one of the metal lines 191 connects a respective one of the contacts 188 with a respective one of the lands 193. A respective conductor is thus formed by a respective contact 188, a respective metal line 191, and a respective land 193 of the signal distribution board 116. A respective one of the contacts 186 of the contactor 170 contacts a respective one of the contacts 188 of the signal distribution board 116 when the backing member 118 of the contactor 170 is secured to the substrate 124 of the signal distribution board 116.

The stand-offs 174 are thin layers of material that are attached to a lower surface of the backing member 118 of the contactor 170. The adhesive 176 is a layer having upper and lower adhesive surfaces. A lower adhesive surface of the adhesive 176 is attached to an upper surface of one of the stand-offs 174. An upper adhesive surface of the adhesive 176 is attached to a lower surface of the backing member 118 of the contactor 170, thereby attaching the stand-off 174 to the backing member 118 of the contactor 170.

When the pressure within the pressure differential cavity 140 in FIG. 6 is reduced, the stand-offs 174 also move closer to the wafer substrate 82. Such movement of the stand-offs 174 towards the wafer substrate 82 causes resilient depression of the contacts 184 of the contactor 170 by the terminals 92 of the wafer substrate 82. Lower surfaces of the stand-offs 174 then come into contact with the upper surface 84 of the wafer substrate 82. The lower surfaces of the stand-offs 174 thereby limit depression of the contacts 184 into the backing member 118 of the contactor 170. A plurality of separated stand-offs 174 are located between the contacts 184.

A plurality of conductive paths is created. Each conductive path includes a respective one of the terminals 92 of the wafer substrate 82, a respective pin 172 of the contactor 170, and a respective contact 188, metal line 191, and land 193 of the signal distribution board 116. The lands 193 and the contacts 188 of the signal distribution board 116 are in a plane that is parallel to a plane of the terminals 92 of the wafer substrate 82. Referring again to FIG. 1, a portable supporting structure is provided jointly by the wafer chuck component 12 at the bottom and the structural component of the distribution board assembly 110 at the top, with the wafer substrate 82 between the wafer chuck component 12 and the structural component of the distribution board assembly 110. Referring again to FIG. 7, electric contact to the terminals 92 of the wafer substrate 82 is provided by the contacts 184 of the contactor 170, and the distribution board assembly 110 has an interface formed by the lands 193 for purposes of connection to another device. The portable pack 108 as shown in FIGS. 4 to 7 is now transported to a test system that can make contact to the interface formed by the lands 193 and provide test signals, power, and ground to the wafer substrate 82. The contacts 184 of the contactor 170 and the terminals 92 of the wafer substrate 82 are entirely surrounded by the substrate cavity seal 14, and are thus kept free of contaminants or moisture.

Figure 8:
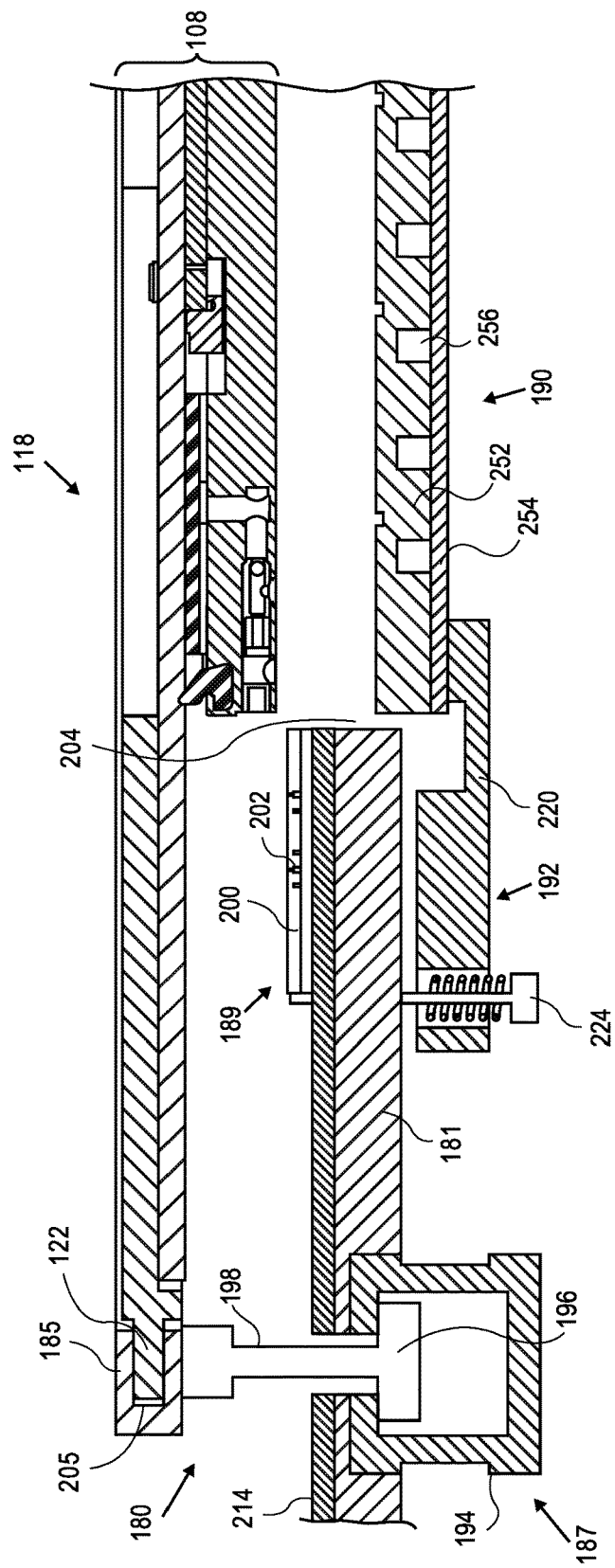
FIG. 8 is a cross-sectional side view of components of the stationary structure and the portable pack, illustrating primarily structural detail.

As illustrated in FIG. 8, the portable pack 108 is received by a stationary structure 180. The stationary structure 180 has a frame 181 that is positioned in a stationary location in a system (not shown). Components of the stationary structure 180 are movable relative to one another. The stationary structure 180, in addition to the frame 181, includes a holding structure 185 for receiving the portable pack 108, four actuators 187 (only one of which is shown), an interface assembly 189, a thermal chuck 190, and a mounting arrangement 192 for the thermal chuck 190.

The actuator 187 includes a cylinder 194, a piston 196 in the cylinder 194, and a connecting piece 198 connected to the piston 196. The piston 196 can slide vertically up and down within the cylinder 194, and a pressure can be increased and decreased behind this piston 196 as well as in front of the piston 196 to move the piston in vertical upward and downward directions. The connecting piece 198 has a lower end mounted to the piston 196 and an upper end mounted to the holding structure 185. The holding structure 185 thus moves up and down together with the piston 196.

The interface assembly 189 has an interface assembly substrate 200 and a plurality of pins 202. The pins 202 are held within the interface assembly substrate 200. The interface assembly substrate 200 is secured to an upper surface of the frame 181. The interface assembly substrate 200 and the frame 181 define a circular opening 204 that is slightly larger than a diameter of the outer surface 20 of wafer chuck component 12.

A horizontal slot 205 is formed in an inner side of the holding structure 185. A similar slot (not shown) is formed in another portion of the holding structure 185. The flange on the edge 122 of the metal backing plate 114 of the distribution board assembly 110 is inserted into the slot 205 in a direction into the paper. The opposite edge (see FIG. 3) is simultaneously inserted into the other slot of the holding structure 185. The portable pack 108 is then suspended by opposing portions of the holding structure 185. The slot 205 holds the flange formed at the edge 122 to prevent upward or downward vertical movement of the portable pack 108 relative to the holding structure 185. When the piston 196 moves down within the cylinder 194, the holding structure 185 also moves down, and the portable pack 108 moves down into contact with the interface assembly 189 of the stationary structure 180.

Referring again to FIG. 7, components of the stationary structure 180 of FIG. 8 are shown, including the interface assembly 189 and a signal and power board 206. Each one of the pins 202 includes first and second components 208 and 210 and a spring 212. The second component 210 has a portion that is located within a portion of the first component 208. The spring 212 is also located within the portion of the first component 208. The pin 202 has two opposing contacts, respectively on the first and second components 208 and 210. Movement of the contacts towards one another requires a force that compresses the spring 212 against a spring force of the spring 212. The contacts move away from one another when the force that compresses the spring 212 is removed.

The interface assembly substrate 200 has two halves with a plurality of openings formed in each half. A pin portion of a first component 208 and a pin portion of a second component 210 are inserted into facing openings of the two halves. Each pin 202 thus has a contact at the top and a contact at the bottom of the interface assembly 189.

The signal and power board 206 has a substrate 214, a plurality of contacts 216, and a plurality of metal leads 218 in the form of traces, metal lines, and and/or vias. The contacts 216 are formed on an upper surface of the substrate 214. The metal leads 218 are connected to the contacts 216.

The interface assembly substrate 200 is mounted to the substrate 214 of the signal and power board 206. A contact of each first component 208 of each pin 202 makes contact with a respective contact 216 of the signal and power board 206. The interface assembly 189 shown in FIG. 7 is mounted through the signal and power board 206 to the frame 181 shown in FIG. 8. When the portable pack 108 moves down into contact with the interface assembly 189, each one of the lands 193 of the signal distribution board 116 makes contact with a respective contact on a respective second component 210 of a respective pin 202 of the interface assembly 189. The lands 193 depress the contacts at the top of the pins 202 upon further movement of the portable pack 108 in a downward direction. A force created by the actuators 187 in FIG. 8 ensures proper contact between the lands 193 and the pins 202.

The terminals of the wafer substrate 82 are then connected through the pins 172 of the contactor 170, the contacts 188, metal lines 191, and lands 193 of the signal distribution board 116, and the pins 202 of the interface assembly 189 to the contacts 216 and metal leads 218 of the signal and power board 206.

Referring again specifically to FIG. 8, the mounting arrangement 192 includes a plurality of mounting pieces 220 (only one of which is shown), and a spring arrangement 224. The thermal chuck 190 is mounted through each one of the mounting pieces 220 and a respective spring arrangement 224 to the frame 181. Downward movement of the portable pack 108 brings the lower surface 24 of the wafer chuck component 12 into contact with an upper surface of the thermal chuck 190. Slight differences in planarity between the lower surface 24 of the wafer chuck component 12 and the upper surface of the thermal chuck 190 are taken up by the spring arrangement 224.

Figure 9:
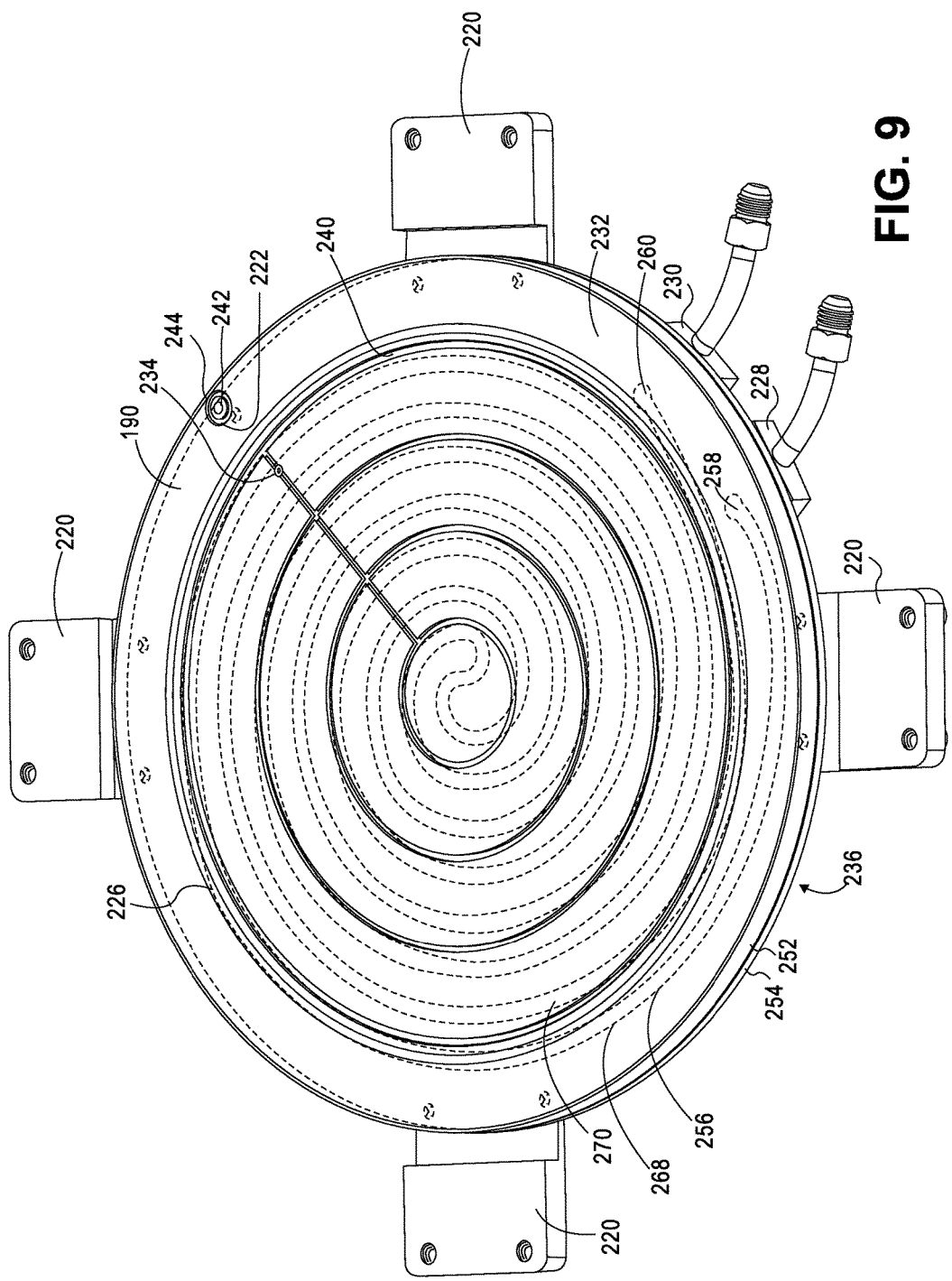
FIG. 9 is a perspective view of the thermal chuck and the components attached to the thermal chuck.

FIG. 9 shows the thermal chuck 190, the mounting pieces 220, a thermal interface cavity seal 226, and two adaptors 228 and 230.

The thermal interface cavity seal 222 is an O ring seal formed in a circular groove 242 in an upper surface 232 of the thermal chuck 190. The thermal interface cavity seal 226 forms a closed loop around a center point of the thermal chuck 190. Approximately two-thirds of the thermal interface cavity seal 226 is inserted into its groove in the upper surface 232 of the thermal chuck 190, and approximately one-third of the thermal interface cavity seal 226 remains above the upper surface 232. The groove for the thermal interface cavity seal 222 is approximately rectangular in cross-section and can accommodate the entire thermal interface cavity seal 226. If the third of the thermal interface cavity seal 226 above the upper surface 232 is compressed into the groove, an upper surface of the thermal interface cavity seal 226 will then be in the same plane as the upper surface 232.

A thermal interface vacuum passage 234 is formed from the upper surface 232 to a lower surface 236 of the thermal chuck 190. A plurality of vacuum grooves 240 are formed in the upper surface 232 of the thermal chuck 190 in an area within the thermal interface cavity seal 226. The thermal interface vacuum passage 234 has an inlet opening within one of the vacuum grooves 240. One of the vacuum grooves 240 is a slot that extends radially from a center point of the upper surface 232 of the thermal chuck 190. Four of the vacuum grooves 240 are concentric rings with center points at a center point of the upper surface 232 of the thermal chuck 190. The vacuum grooves 240 are connected to one another and thus form a single interconnected cavity below the upper surface of the thermal chuck 190.

A vacuum port 242 is formed from the upper surface 232 to the lower surface 236 in an area of the upper surface 232 outside the thermal interface cavity seal 226. A vacuum port seal 244 is formed into a groove that surrounds the vacuum port 242. The vacuum port 242 is aligned with and connected to the outlet opening 156 of the pressure reduction passage 144 in the wafer chuck component 12 shown in FIG. 6.

In use, the lower surface 24 of the wafer chuck component 12 in FIG. 6 contacts the thermal interface cavity seal 226 and the vacuum port seal 244 shown in FIG. 9. A thermal interface cavity is defined at the bottom by the upper surface 232 of the thermal chuck 190, at the top by the lower surface 24 of the wafer chuck component 12, and on the sides by the thermal interface cavity seal 226 connecting the upper surface 232 of the thermal chuck 190 with the lower surface 24 of the wafer chuck component 12. The thermal interface vacuum passage 234 is permanently connected to a pump through a valve (not shown), and air is pumped from the thermal interface cavity through the thermal interface vacuum passage, thereby reducing a pressure within the thermal interface cavity. The pressure within the thermal interface cavity is thus lower than ambient pressure above the portable pack 108 and ambient pressure below the thermal chuck 190. The thermal interface cavity reduces in size until the lower surface 24 of the wafer chuck component 12 contacts the upper surface 232 of the thermal chuck 190 and the thermal interface cavity seal 226 is compressed into its groove. The only remaining portion of the thermal interface cavity is then defined by the vacuum grooves 240, and the reduced pressure is maintained within the vacuum grooves 240 to keep the surfaces 24 and 232 against one another. Because the surfaces 24 and 232 are against one another, heat can conduct between the thermal chuck 190 and the wafer chuck component 12 in both directions.

The vacuum port seal 244 seals with the lower surface 24 of the wafer chuck component 12 around the outlet opening 156 of the pressure reduction passage 144. The pump maintains the vacuum port 242 at a reduced pressure, and thus maintains the outlet opening 156 at a reduced pressure in case of leakage of the pressure reduction passage check valve 146.

The thermal chuck 190 is made up out of upper and lower pieces 252 and 254 that are brazed to one another. A thermal control passage 256 is machined into a lower surface of the upper piece 252. As specifically shown in FIG. 9, the thermal control passage 256 has an inlet 258 and an outlet 260 formed through the lower piece 254. A fluid can flow from the inlet 258 through successive sections of the thermal control passage and out of the outlet 260. A first half of the thermal control passage 256 forms a first spiral 268 clockwise to a center of the thermal chuck 190 in plan view. A second half of the thermal control passage 256 forms a second spiral 270 counter-clockwise away from the center of the thermal chuck 190. Two sections of the first spiral 268 have one section of the second spiral 270 between them. Two sections of the second spiral 270 have one section of the first spiral 268 between them. As such, the thermal control passage 256, for example, has first, second, and third sections in series after one another with the third section located between the first and second sections in cross-sectional plan view. The thermal control passage 256 also has a fourth section in series after the third section. Depending on where the fourth section is selected, the fourth section can be either between the second and third sections or between the first and second sections. In either case, the first and second sections are sections of a first spiral and the third section is a section of a second spiral that is not located on the first spiral.

There may, for example, be a 10 degree Celsius difference in temperature between the fluid flowing through the inlet 258 and the fluid flowing out of the outlet 260. Adjacent sections of the thermal control passage 256 in an outer region of the thermal chuck 190 will then be at temperatures that are 10 degrees Celsius different. The temperature between the two sections in the outer region of the thermal chuck 190 will, however, be an average of the temperatures at the inlet 258 and the outlet 260, i.e., five degrees Celsius above and below the temperatures of the inlet 258 and the outlet 260. As heat conducts from the fluid as the fluid flows towards the center of the thermal chuck 190, the temperature of the fluid between adjacent sections of the thermal control passage 256 near a center of the thermal chuck 190 may only be four degrees Celsius. However, the difference between the temperatures of the adjacent sections of the thermal control passage 256 near a center of the thermal chuck 190 is still the same as the average of the temperatures of the inlet 258 and outlet 260. The thermal chuck 190 thus has the same temperature in an outer region and near the center thereof.

The adaptors 228 and 230 are mounted to the thermal chuck 190 and are connected to the inlet 258 and the outlet 260.

Figure 10:
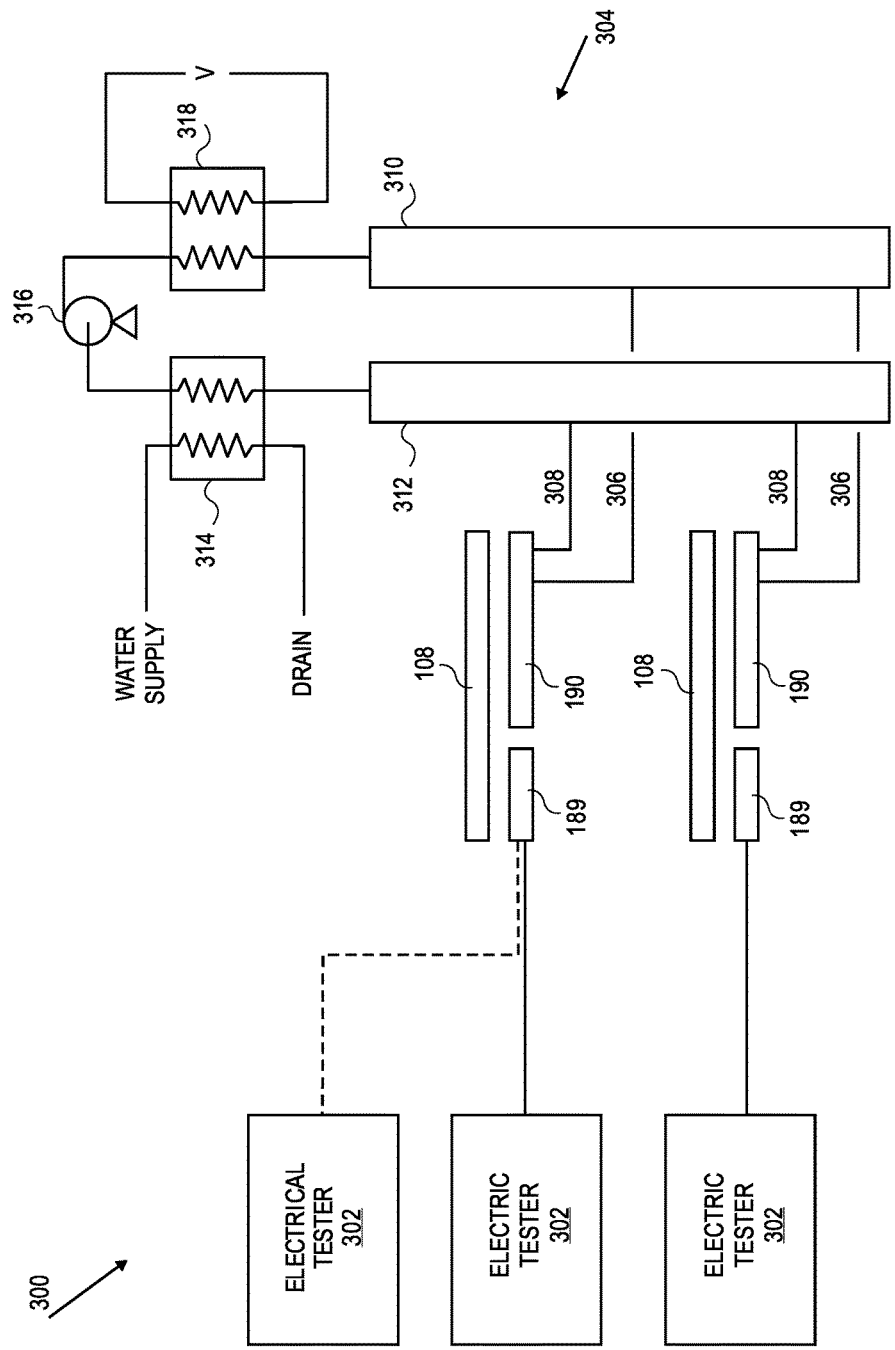
FIG. 10 is a diagram illustrating components of a tester apparatus according to an embodiment of the invention.

FIG. 10 illustrates a tester apparatus 300 that includes a plurality of components shown in FIG. 8, including a plurality of portable packs 108, a plurality of thermal chucks 190, and a plurality of interface assemblies 189. Each portable pack 108 is connected to a respective thermal chuck 190 and each portable pack 108 has a respective interface of lands that makes contact with a respective interface of pins irrespective of the interface assemblies 189. The tester apparatus 300 further includes a plurality of electric testers 302 and a thermal control system 304.

One or two electric testers 302 are connected to each portable pack 108. Each electric tester 302 is configured to run a burn-in test according to a pre-programmed set of instructions. The instructions are utilized to transmit electric signals and to receive electric signals through a respective one of the interface assemblies 189 to and from the microelectronic circuits of the wafer substrates (not shown) held in the portable packs 108. The thermal control system includes inlet and outlet pipes 306 and 308, inlet and outlet manifolds 310 and 312, a cooling heat exchanger 314, a recirculating pump 316, and a heater arrangement 318. Each inlet pipe 306 is disconnected from a respective adaptor such as the adaptor 228 in FIG. 9, and each outlet pipe 308 is connected to a respective adaptor, such as the adaptor 230 in FIG. 9. A closed loop valve is formed by the thermal control passage 256 in one of the thermal chucks 190, one of the outlet pipes 308, the outlet manifold 312, a path through the heat exchanger 314, the pump 316, a path through the heater arrangement 318, the inlet manifold 310, and one of the inlet pipes 306. The thermal control passages 256 of the thermal chucks 190 are connected in parallel to the manifolds 310 and 312.

The heat exchanger 314 also has a path connected to a water supply and to a drain. Water at room temperature can flow through the heat exchanger 314 and heat can conduct to the water.

The heater arrangement 318 has an electric coil that is connected to a voltage supply. The electric coil heats up when the electric supply is switched on. Heat can be transferred from the heating coil when current flows therethrough.

In use, the components that define the recirculating path are initially filled with oil. The pump 316 is switched on and the oil recirculates through the heater arrangement 318, the inlet manifold 310, the inlet pipes 306, the thermal chucks 190, the outlet pipes 308, the outlet manifold 312, and the heat exchanger 314 back to the pump 316. When the voltage supply is switched on, the electric coil of the heater arrangement 318 heats up, and heat transfers from the electric coil to the oil. The oil is heated from room temperature of 21 degrees Celsius to above 100 degrees Celsius, typically to a temperature of approximately 170 degrees Celsius. The oil at 170 degrees Celsius enters the thermal chucks 190 and gradually heats the thermal chucks 190. Because heat is transferred to the thermal chucks 190, the oil leaving the thermal chucks 190 through the outlet pipes 308 is at a lower temperature, for example, 150 degrees Celsius. When the thermal chuck 190 is heated to a temperature that is sufficiently high for purposes of testing the integrated microelectronic circuits 90 in FIG. 2, the electric tester then tests the integrated microelectronic circuits 90. Burn-in testing is typically carried out on the integrated microelectronic circuits 90.

As the integrated microelectronic circuits are tested, they gradually heat up and need to be cooled to be maintained at the temperature appropriate for burn-in testing. Current to the electric coil of the heater arrangement 318 is switched off. Water from the water supply is switched on. Heat transfers from the oil to the water of the water supply, thereby cooling the oil. The oil entering the thermal chucks 190 may now, for example, be at 160 degrees Celsius, and oil leaving the thermal chucks 190 may be at 170 degrees Celsius. The heat exchanger 314 cools the oil from 170 degrees Celsius to 160 degrees Celsius. What should be noted is that the oil typically does not need to be cooled to below 150 degrees Celsius. According to tests that were conducted, it was found that it was not necessary to drop the temperature of the oil to, for example, below 100 degrees Celsius or to room temperature. Instead, a high flow rate of oil, typically between 3 and 5 liters per minute, is sufficient to prevent the thermal chuck 190 from overheating and to maintain the 170 degrees Celsius temperature.

Localized heating is used in a tester apparatus 300. A conventional burn-in tester, by contrast, has a burn-in oven and burn-in port carrying integrated microelectronic circuit packages which are inserted into the burn-in oven. Heat converts from air in the burn-in oven to the integrated microelectronic circuit packages and to the burn-in boards. In a general heating arrangement, heated air thus surrounds the burn-in boards that carry the integrated microelectronic circuit packages. In the localized heat arrangement of the tester apparatus of FIG. 10, air surrounding the portable packs 108 is typically at approximately room temperature of 21 degrees Celsius, and the localized areas of portable packs 108 are heated (or cooled) by the thermal chucks 190.

Localized heating has its own unique set of challenges. Referring again to FIGS. 3 and 4, the signal distribution board assembly 116 does not heat above room temperature by as much as the backing member 118 of the contactor 170, and the backing member 118 of the contactor 170 does not heat above room temperature by as much as the wafer substrate 82. The backing member 118 of the contactor 170 may, for example, heat from 21 degrees Celsius to 171 degrees Celsius, and the signal distribution board assembly 116 may simultaneously heat from 21 degrees Celsius to 121 degrees Celsius. The coefficients of thermal expansion of the backing member 118 of the contactor 170 and the signal distribution board assembly 116 are engineered so that the backing member 118 of the contactor 170 and the signal distribution board assembly 116 expand and contract at a similar rate. In the given example, a coefficient of thermal expansion (CTE) of the signal distribution board assembly 116 may be 10 parts per million (ppm) and the CTE of the backing member 118 of the contactor 170 may be 4.5, while the CTE of the wafer substrate 82 may be a given 3.2. In another example, the CTE of the signal distribution board 116 may be between 5 and 6 or may even be lower than the CTE of the backing member 118 of the contactor 170 in a different set of thermal conditions.

In the given example, the CTE ratio of the CTE of the signal distribution board 116 to the CTE of the backing member 118 of the contactor 170 is 2.22. The CTE ratio can be defined as follows:

$$CTE\ ratio = \frac{CTE\ of\ first\ element}{CTE\ of\ second\ element}$$

The signal distribution board 116 may heat up from a low signal distribution board temperature to a high signal distribution board temperature, and the backing member 118 of the contactor 170 may heat up from a low contactor temperature to a high contactor temperature and a temperature ratio. A temperature increase ratio can be defined as follows:

$$Temperature\ increase\ ratio = \frac{High\ temperature\ of\ second\ component - low\ temperature\ of\ second\ component}{High\ temperature\ of\ first\ component - low\ temperature\ of\ first\ component}$$

A multiple of the CTE ratio and the temperature increase ratio can be defined as follows:

CTE ratio X Temperature increase ratio=X

Ideally, X should be as close to 1 as possible. In a preferred embodiment, X should be closer to 1 than the CTE ratio. The CTE ratio is typically between 0.2 and 5, more preferably between 0.9 and 1.1, and X is preferably between 0.8 and 1.2.

Reference is again made to FIG. 8. Upon completion of burn-in testing of the integrated microelectronic circuits 90, the holding structure 185 is raised, thereby disconnecting the land interface of the portable pack 108 from the interface assembly 189. The portable pack 108 is then removed from the holding structure 185 by sliding the portable pack 108 in a direction out of the paper.

Reference is again made to FIG. 6. A vacuum release passage 272 is formed through the wafer chuck component 12 and a vacuum release valve 274 is located within the vacuum release passage 272. The vacuum release passage 272 has first, second, and third portions 276, 278, and 280. The first and second portions 276 and 278 are drilled respectively from the lower surface 24 and the upper surface 22 of the wafer chuck component 12. The second portion 336 is drilled from the outer surface 20 and connects the first and second portions 276 and 278 to one another. The first portion 276 has an air inlet opening 282 and the second portion 336 has an air outlet opening 284 within the pressure differential cavity 140.

The vacuum release valve is a shuttle valve, and a release valve opening 286 is formed in the lower surface 24 of the wafer chuck component 12 on a side of the vacuum release valve 274 opposing the air outlet opening 284 of the vacuum release passage 272. The air inlet opening 282 is normally maintained at ambient pressure. The lower pressure within the pressure differential cavity 140 keeps a ball valve component 288 of the vacuum release valve 274 on a seat 290 thereof. In order to open the portable pack 108, a pressure on the release valve opening 286 is reduced to below the pressure within the pressure differential cavity 140. A pressure differential between the pressure differential cavity 140 and the release valve opening 286 moves the ball valve component 288 off the seat 290. The air inlet opening 282 is then placed in communication with the air outlet opening 284, and air flows through the vacuum release passage 272 into the pressure differential cavity 140. The pressure differential cavity 140 returns to ambient pressure. Because the pressure differential cavity 140 is at the same pressure as air outside the portable pack 108, the distribution board assembly 110 can be lifted off the wafer substrate 82 and the wafer chuck assembly 10. The wafer substrate 82 can then be removed from the wafer chuck assembly 10.

Figure 11:
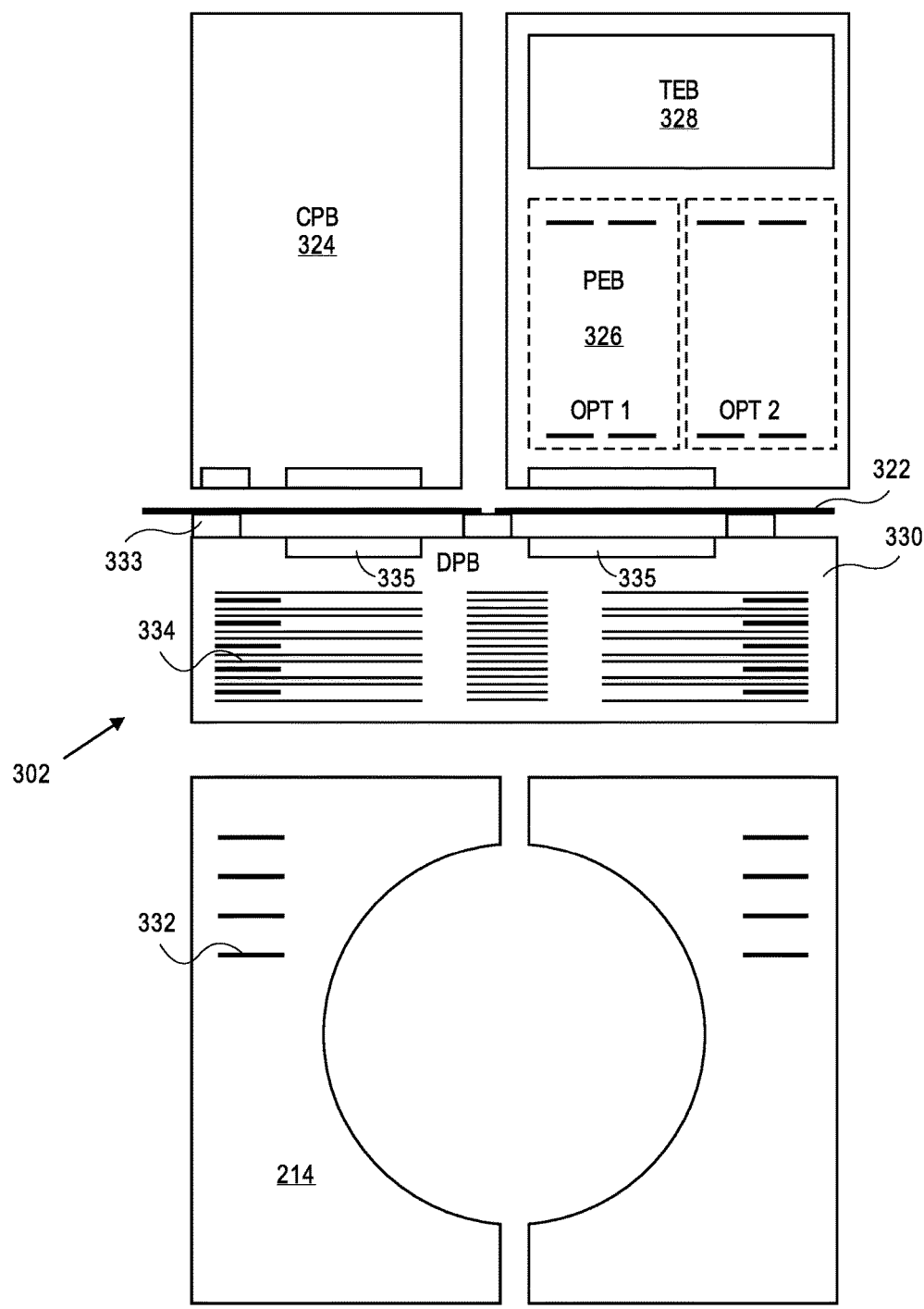
FIG. 11 is a plan view of one electric tester shown in FIG. 10.

FIG. 11 illustrates two of the substrates 214 shown in FIGS. 7 and 8 that form a single interface, and also shows one of the electric testers 302 of FIG. 10.

The electric tester 302 includes a backplane 322, a configurable power board (CPB) 324, a pin electronics board (PEB) 326, a test electronics board (TEB) 328, a die power board (DPB) 330, and a plurality of power buses 333. The configurable power board 324 and the pin electronics board 326 are structurally connected to the die power board 330 through the backplane 322. The configurable power board 324 and the pin electronics board 326 are also electrically connected to respective ones of the power buses 333. The test electronics board 328 is mounted on top and electrically connected to the pin electronics board 326.

The electric tester 302 is thermally and mechanically disconnected from the substrate 214. A plurality of flexible attachments (not shown) is used to connect the die power board 330 to the substrate 214. A plurality of connectors 332 are located on the substrate 214 and are connected to the contacts 216 in FIG. 7 via the conductors 218. Another set of connectors 334 are located on the die power board 330. Each flexible attachment has two connectors at opposing ends. One of the connectors of the flexible attachment is connected to one of the connectors 332, and the opposing connector of the flexible attachment is connected to one of the connectors 334.

Power, signal, and ground can be provided by the configurable power board 324 and the pin and test electronics boards 326 and 328 through connectors 335 in the backplane 322, the die power board 330, and the flexible attachments to the integrated circuits 92 of FIG. 2. Each one of the boards 324, 326, 328, and 330 has a respective substrate and a respective circuit or circuits on the respective substrate, through which power, ground, or signals can be provided to or from the circuits 92.

Figure 12:
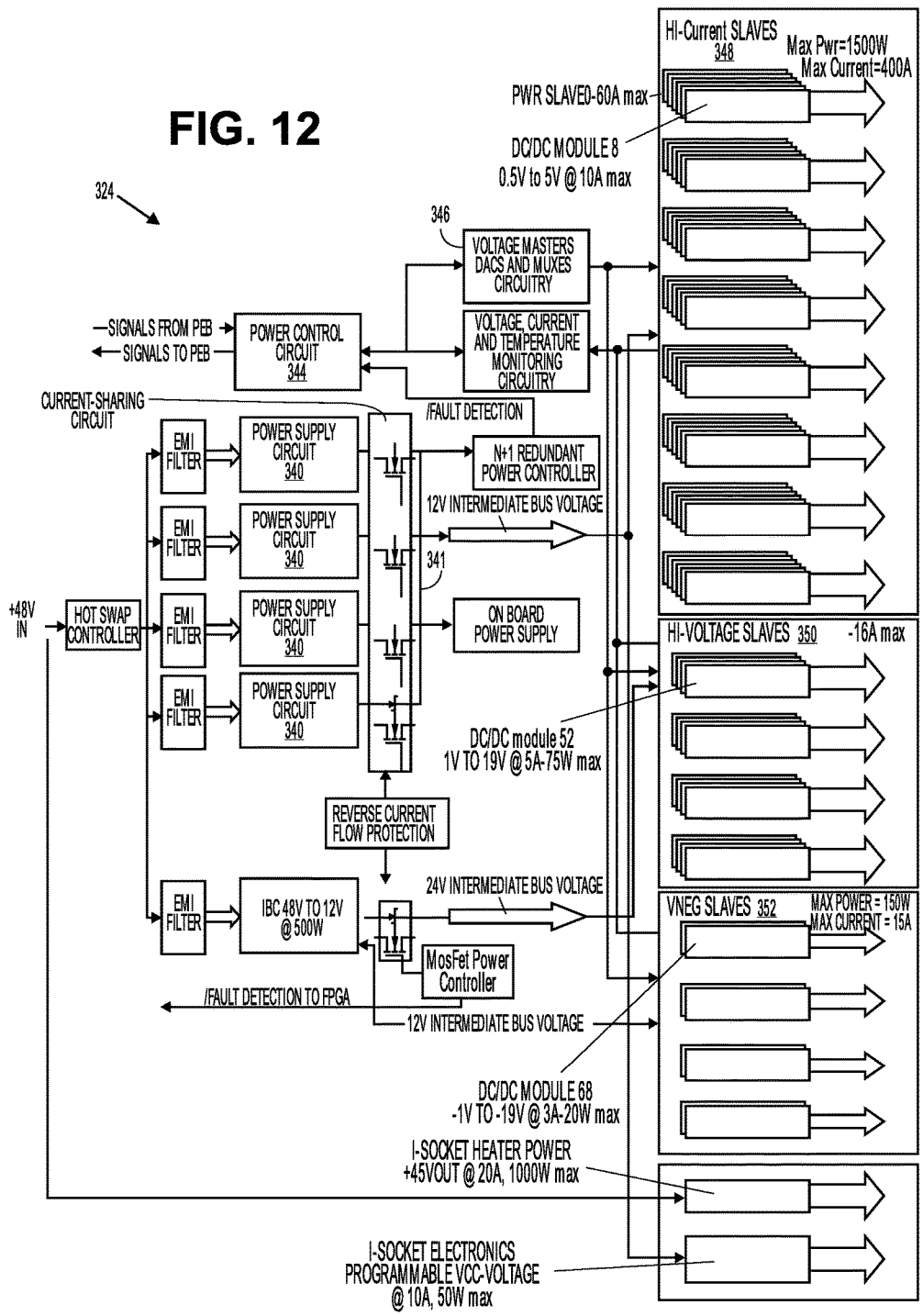
FIG. 12 is a block diagram of a configurable power board of the electric tester of FIG. 11.

As illustrated in FIG. 12, the configurable power board 324 includes four power supply circuits 340 (IBC48V to 12V@500 W). The power supply circuits 340 are connected to one another in parallel. Should one of the power supply circuits 340 fail, power is still provided by the remaining power supply circuits 340. The four power supply circuits 340 are thus n plus one, wherein n is 3. Should one of the power supply circuits 340 fail, power will still be provided by n power supply circuits 340.

A current-sharing circuit connects the power supply circuits 340 to power buses 341. The current-sharing circuit detects when power from one of the power supply circuits 340 reduces to below zero. Upon detection of loss in power in one of the n plus one power supply circuits 340, the current-sharing circuit switches a connection from the one of the n plus one power supply circuits 340 that has failed off, to eliminate current from the failed one of the n plus one power supply circuits 340. Current is then shared by the n power supply circuits 340 that have not failed.

Figure 13A:
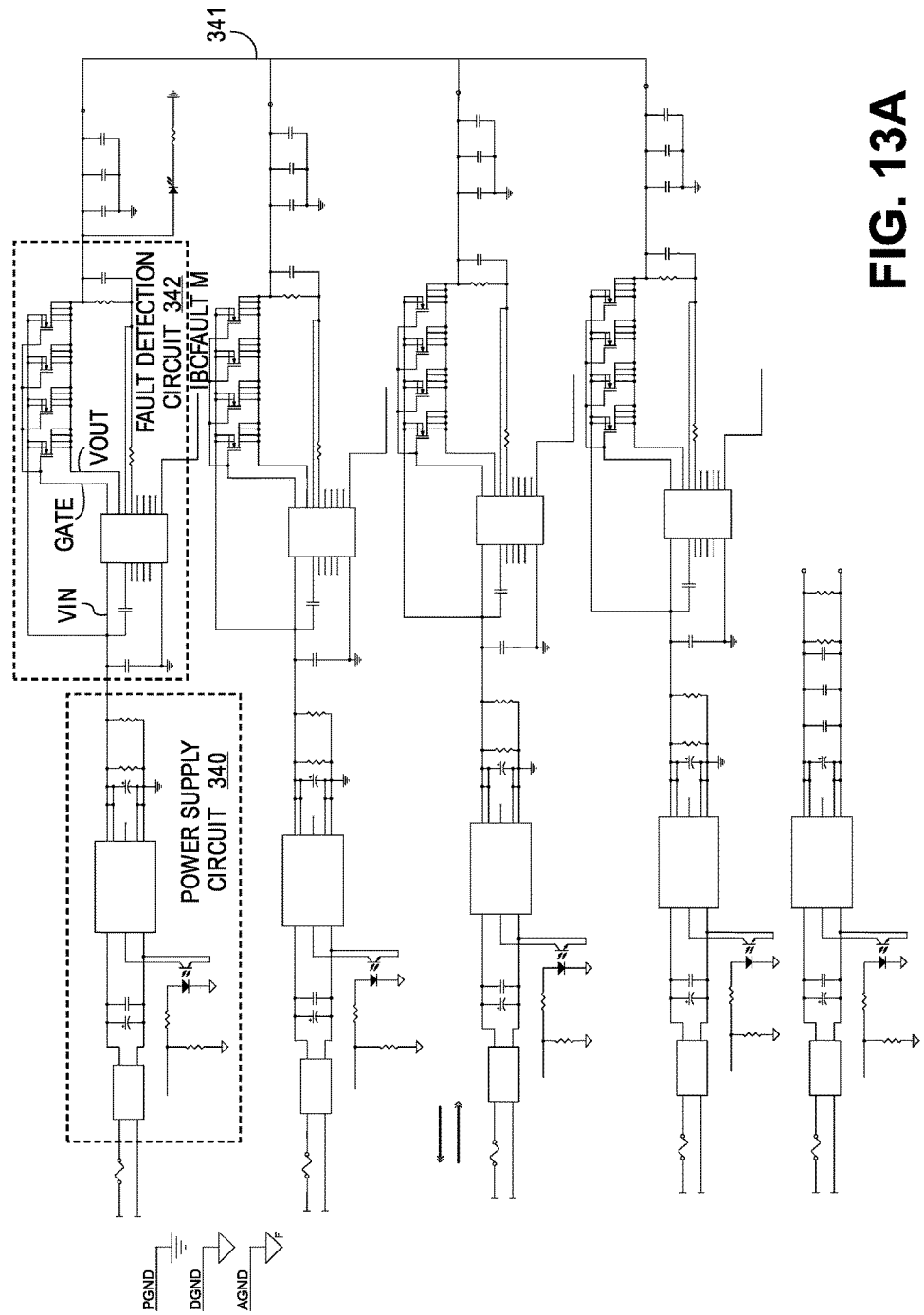
FIG. 13A is a circuit diagram of a power supply circuit and a power-sharing circuit of the configurable power board of FIG. 12.

FIG. 13A shows that each one of the power supply circuits 340 is connected to a respective fault-detection circuit 342. The fault-detection circuits 342 jointly make up the current-sharing circuit of FIG. 12. Each one of the fault-detection circuits 342 detects power loss from a respective one of the power supply circuits 340, and disconnects the respective power supply circuit 340 from a power bus 341. In the fault-detection circuit 342, the voltage in (VIN) must be more positive than the voltage out (VOUT) in order for the power supply circuit 340 to be connected to the power bus 341. If VIN is not more positive than VOUT, GATE is deenergized and a fault signal is provided on a fault line (IBCFAULTIN). In FIG. 12, the fault is provided to the power supply control circuitry 344, which is connected to a control line (IBC_INHIBIT_N). The power control circuitry 344 can be used to switch power provided by the power supply circuit 340 on or off. All the power supply circuits 340 are under the control of the power supply control circuitry 344.

The power supply control circuitry 344 is also powered by the power supply circuits 340 through the power bus 341. The power supply control circuitry 344 is programmed to control which ones of the power supply circuits 340 are switched on and which ones are switched off. One of the power supply circuits 340 is always on, so that power is always provided to the power supply control circuitry 344. As such, loss of power to the power supply control circuitry 344 is avoided and does not have to be restarted and reprogrammed. The power supply control circuitry 344 is thus utilized to switch between a test mode, wherein power is provided by all four of the power supply circuits 340, and a power-save mode, wherein power is provided by only one of the power supply circuits 340. The current-sharing circuit detects that power is lost by all except one of the power supply circuits 340, and disconnects all of the power supply circuits 340 from the power bus 341, except for one of the power supply circuits 340.

Figure 13B:
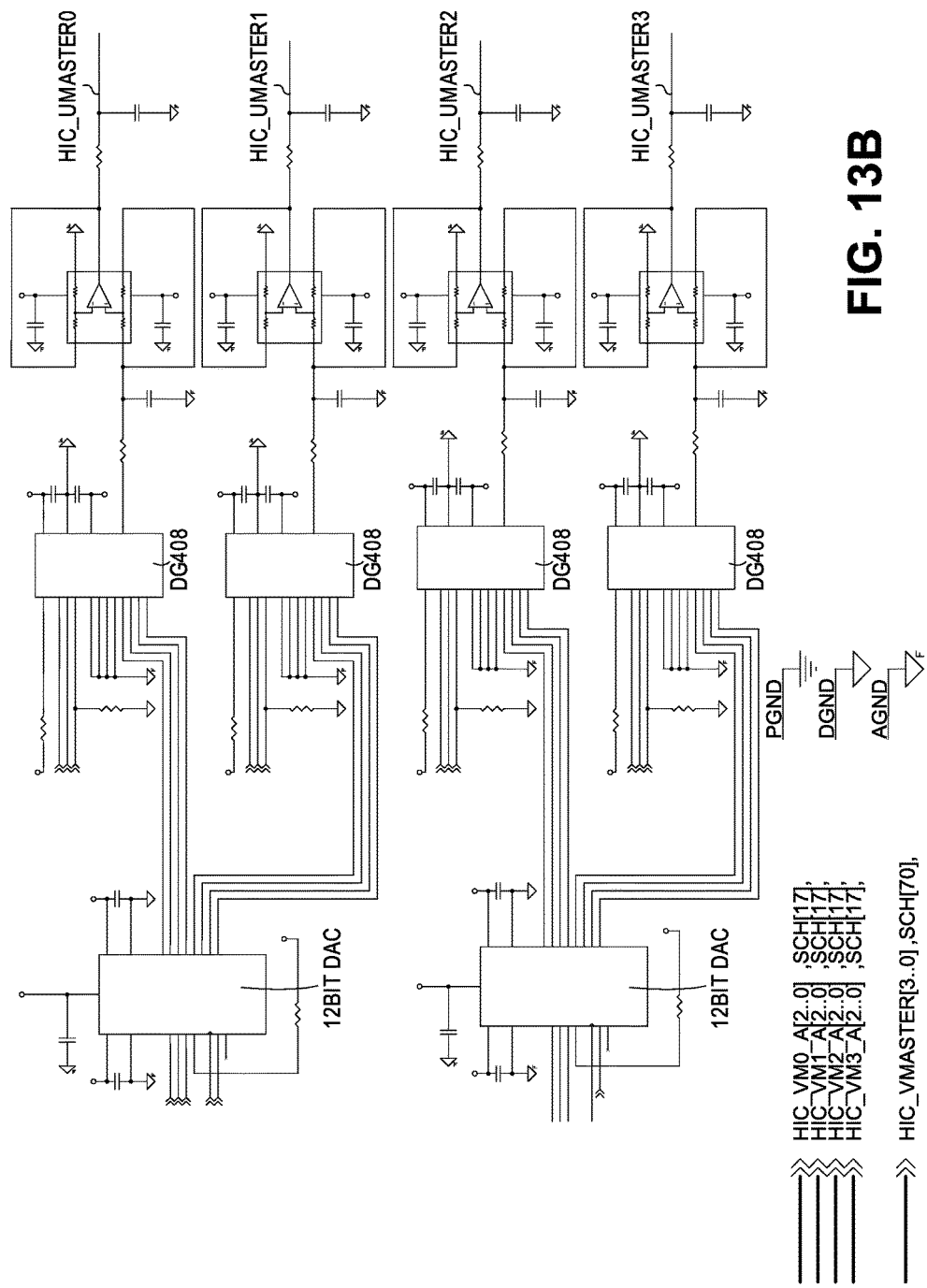
FIG. 13B is a circuit diagram of a voltage masters DACS and MUXES circuit of the configurable power board of FIG. 12.

The circuits shown in FIG. 13A provide 12V power to the power bus 341. FIG. 12 shows a voltage masters DACS and MUXES circuit 346 that is also shown in FIG. 13B. The circuit in FIG. 13B establishes four master voltage levels (HIC_VMASTER0 to HIC_VMASTER4). The master voltages are regulated by separate digital-to-analog converters (12BITDAC). As such, the circuit of FIG. 13B can simultaneously provide four different voltages, each capable of five different levels switched by a multiplexer (DG408). The circuit of FIG. 13B is under the control of the power supply control circuitry 344 of FIG. 12.

Referring again to FIG. 12, the voltage masters DACS and MUXES circuit 346 is connected to high-current slaves 348, high-voltage slaves 350, and additional slaves 352. Each high-current slave 348 is arranged in "primary" groups of six high-current modules. Eight "primary" groups of high-current slaves 348 are arranged in a "super" group of 48 high-current modules. Four high-voltage slaves 350 are arranged in a "primary" group of high-voltage slaves 350, and four "primary" groups of high-voltage slaves 350 are arranged in one "super" group of 16 high-voltage modules. The four voltages provided by the voltage masters DACS and MUXES circuit 346 are provided to each "primary" group of high-current slaves 348 and each "primary" group of high-voltage slaves 350 on four separate lines.

Figure 13C:
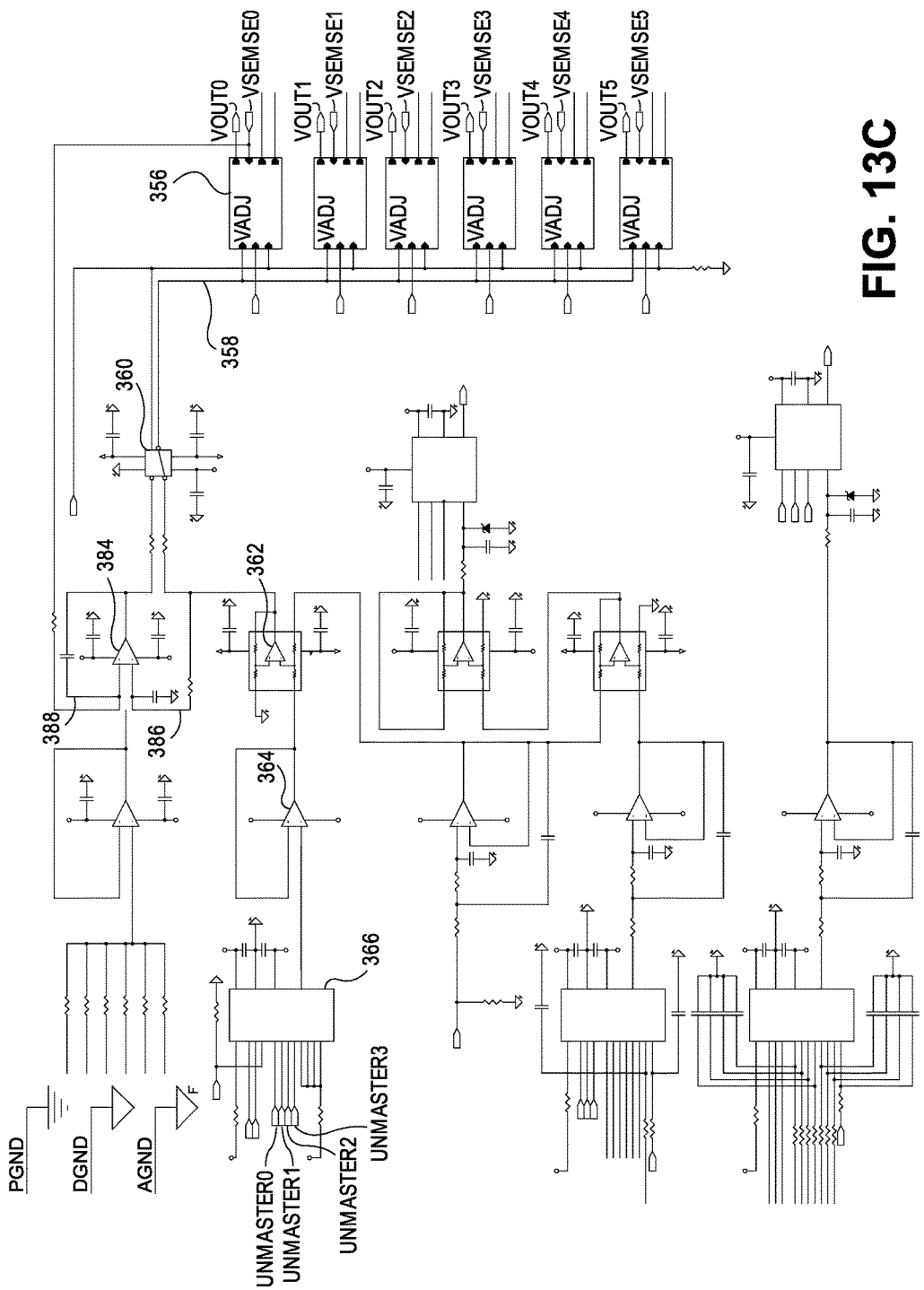
FIG. 13C is a circuit diagram of a "primary" group of high-current slaves of the configurable power board of FIG. 12.

FIG. 13C illustrates one of the "primary" groups of high-current slaves 348 of FIG. 12. Six current amplifiers 356 are provided. Voltage-adjust lines (VADJ) of the current amplifiers 356 are connected to a common line 358. The line 358 is connected through a switch 360, two amplifiers 362 and 364, and a voltage selector 366 to the four voltage lines (VMASTER) on the right in the circuit in FIG. 13B. The voltage selector 366 is used to select a respective one of four voltages that is provided to the current amplifiers 356.

Figure 14:
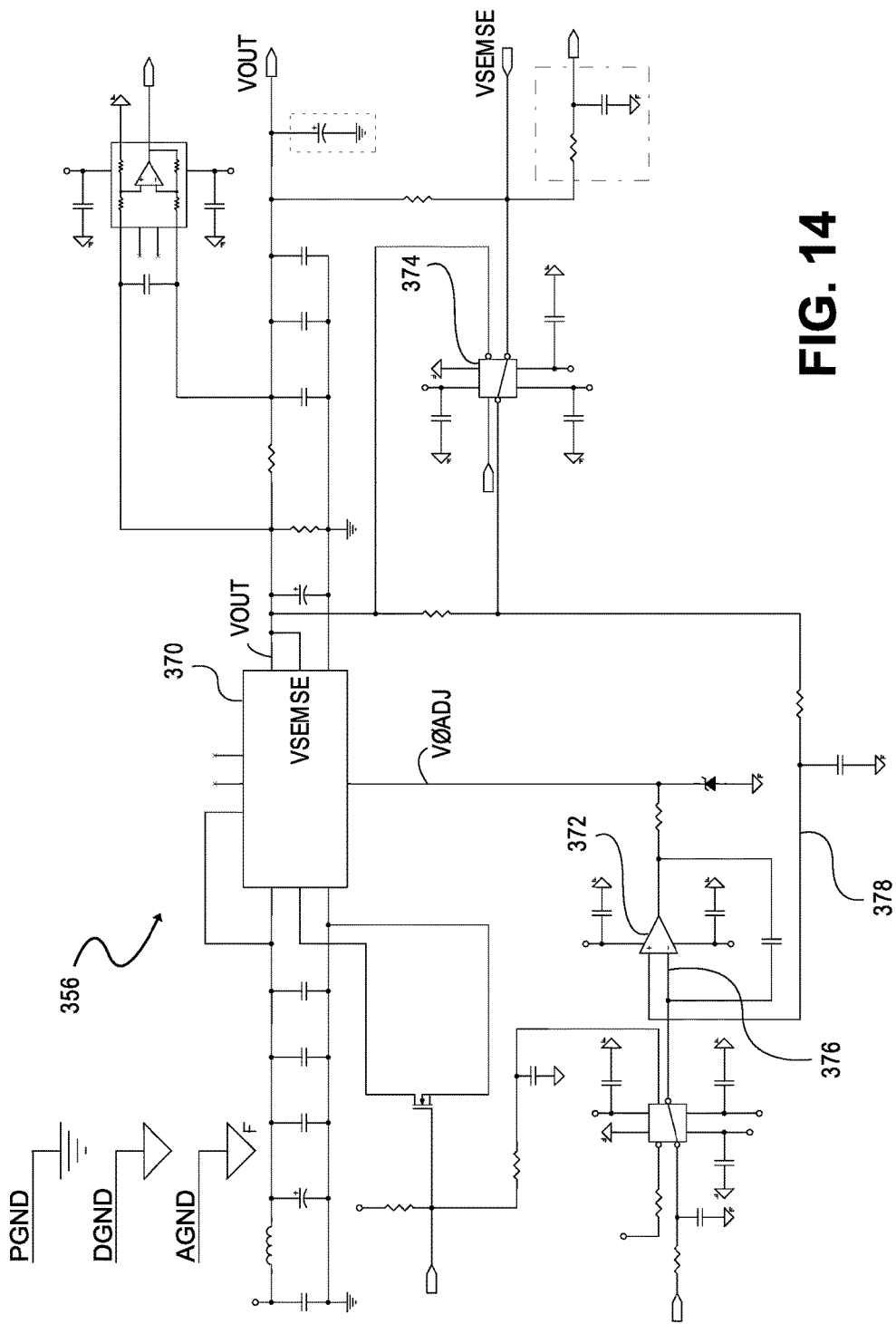
FIG. 14 is a circuit diagram of one of six current amplifiers of the primary group of FIG. 13C.

FIG. 14 illustrates one of the current amplifiers 356 of FIG. 13C. The current amplifier 356 has a current amplification module 370, an amplifier 372, a switch 374, and first and second input lines 376 and 378 to the amplifier 372.

The current amplification module 370 has a voltage reference (V0ADJ), and is connected to the 12V power supply on the power bus 341 in FIG. 13A to apply current to an output (VOUT).

The voltage reference line (V0ADJ) is connected through the amplifier 372 and the first input line 376 to the common line 358 in FIG. 13C. The current amplification module 370 drives the output (VOUT) to the same voltage as the voltage reference line (V0ADJ). When the switch 374 is in a first configuration, where the second input line 378 is disconnected from a sense line (VSENSE), a voltage on the second input line 378 follows VOUT, thereby keeping VOUT locally locked to VADJ.

When the switch 374 is in a second configuration, where the sense line (VSENSE) is connected to the second input line 378 of the amplifier 372, the reference (V0AJD) on the amplification module 370 follows the remote voltage on the sense line (VSENSE). The voltage on the output (VOUT) is then under the control of the sense line (VSENSE). It should be understood that the output (VOUT) and the input (VSENSE) are both ultimately connected to the terminals 92 of the substrate 82 in FIG. 2.

Referring again to FIG. 13C, each one of the current amplifiers 356 has a separate output (VOUT) and a separate sense line (VSENSE). A separate voltage can be sensed on the respective sense lines, and current to the respective output lines can be different when the current configuration circuit shown in FIGS. 13C and 14 is in the second configuration.

In the second configuration, the switch 360 connects the common line 358 to the amplifier 362. In the first configuration, the switch 360 connects the common line 358 to an output of an amplifier 384. The amplifier 384 has first and second input lines 386 and 388. The first input line 386 is connected to an output from the amplifier 362. The second input line 388 is connected to the sense line (VSENSE0) of only one of the current amplifiers 356. The voltage on the common line 358 thus follows a voltage on the sense line (VSENSE0) when the current configuration circuit of FIGS. 13C and 14 is in the first configuration.

Figure 15:
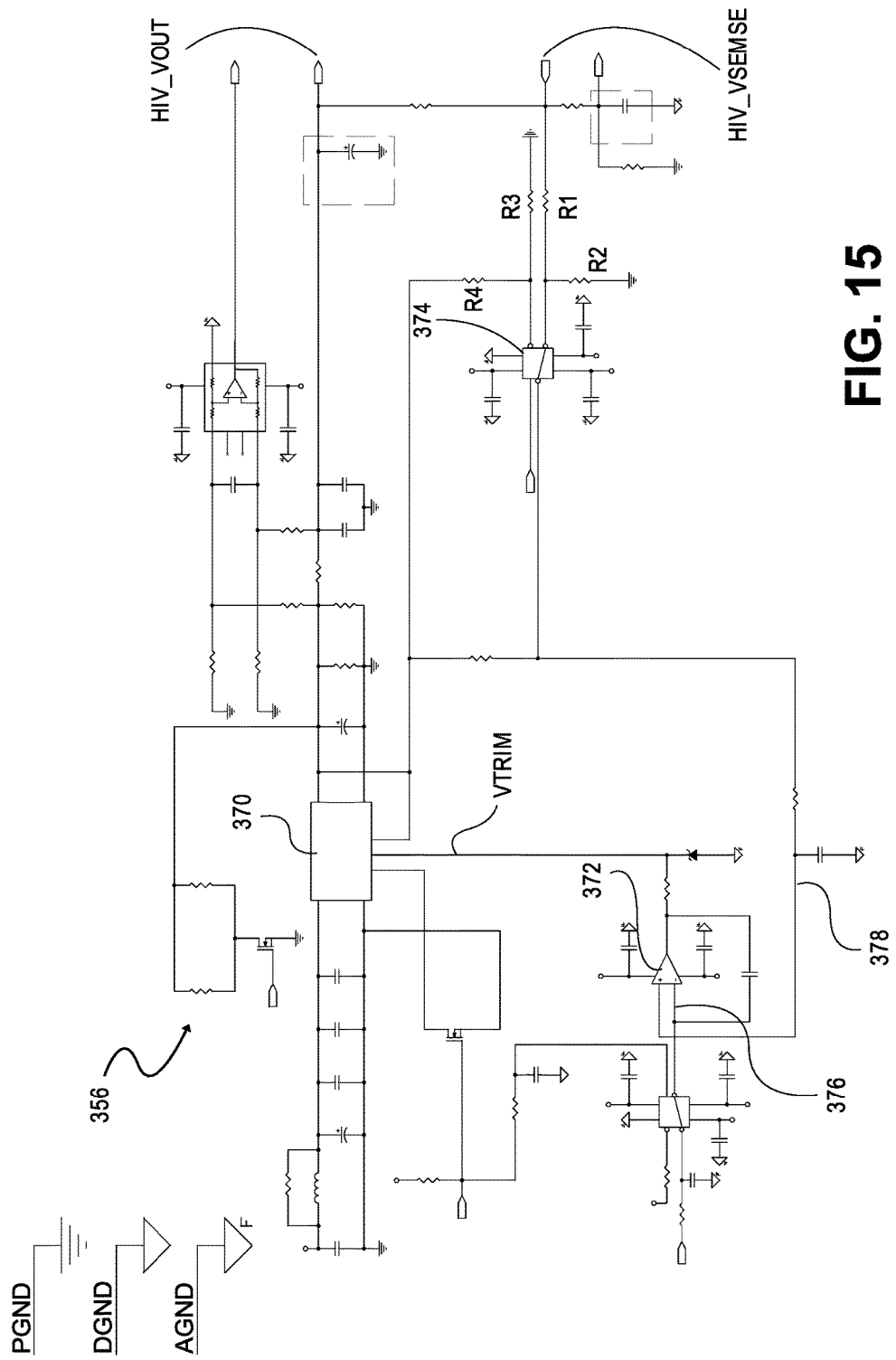
FIG. 15 is a circuit diagram of a voltage and current amplifier of one high-voltage slave of the configurable power board of FIG. 12.

Referring again to FIG. 12, each "primary" group of high-voltage slaves 350 includes a circuit that is the same as the current configuration circuit of FIG. 13C, except that each one of the current amplifiers 356 is used as a current and voltage amplifier. Each one of the current and voltage amplifiers has a respective circuit, as shown in FIG. 15. The voltage and current amplifier of FIG. 15 is the same as the current amplifier of FIG. 14, except that four voltage divider resistors R1, R2, R3, and R4 are provided, and the current amplification module 370 in FIG. 14 serves as a current and voltage amplification module. A sense line (HIV_VSENSE) is connected through the resistor R1 to the switch 374. The sense line (HIV_VSENSE) is also connected to the resistors R1 and R2 to ground. The resistors R1 and R2 thus serve as voltage dividers of the voltage on the sense line (HIV_VSENSE) to the switch 374.

Similarly, the switch 374 is connected through the resistor R4 to a voltage sense line (VSENSE) and an output (VOUT) on the voltage and current amplification module 370, and the same terminal on the switch 374 is also connected through the resistor R3 to ground. The voltage and current amplification module 370 amplifies voltage depending on a voltage on the VTRIM line thereof.

It can thus be seen, with reference in particular to FIGS. 13 and 14, that an operator can switch between first and second configurations. In the first configuration, current of, for example, 60 A can be provided and be shared by six slaved module outputs. In the second configuration, approximately 10 A can be provided by each one of the six different module outputs, and the currents can float independently of one another.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A thermal control apparatus, comprising:
a thermal chuck having a thermal control passage with an inlet, an outlet, and at least first, second, and third sections in series after one another along a path of the fluid from the fluid inlet to the fluid outlet, and the third section is located between the first and second sections in cross-sectional plan view, wherein the first and second sections are sections of a first spiral that spirals inward from the fluid inlet and the third section is a section of a second spiral that spirals outward to the fluid outlet.

2. The thermal control apparatus of claim 1, wherein the thermal control passage has a fourth section in series after the third section along the path of the fluid, the fourth section being located between the second and third sections.

3. The thermal control apparatus of claim 2, wherein the fourth section forms part of the second spiral.

4. The thermal control apparatus of claim 1, wherein the thermal control passage has a fourth section forming part of the first spiral, and the fourth section is located between the first and second sections in cross-sectional plan view.

5. A tester apparatus, comprising:
a portable supporting structure for holding a substrate carrying a microelectronic circuit and having a plurality of terminals connected to the microelectronic circuit;
a plurality of contacts on the portable supporting structure, the contacts matching the terminals for making contact to the terminals;
a first interface on the portable supporting structure and connected to the contacts;
a stationary structure, the portable supporting structure being receivable to be held by the stationary structure and being removable from the stationary structure;
a second interface on the stationary structure, the second interface being connected to the first interface when the portable structure is held by the stationary structure and being disconnected from the first interface when the portable supporting structure is removed from the stationary structure;
a thermal chuck on the stationary structure, the thermal chuck having a thermal control passage with an inlet, an outlet, and at least first, second, and third sections in series after one another along a path of the fluid from the fluid inlet to the fluid outlet, and the third section is located between the first and second sections in cross-sectional plan view, heat transferring through the thermal chuck between the substrate and the fluid in the thermal control passage; and
an electrical tester connected through the second interface, the first interface and the contacts to the terminals so that signals are transmitted between the electrical tester and the microelectronic circuit to test the microelectronic circuit.

6. The tester apparatus of claim 5, wherein the portable supporting structure includes first and second components for holding the substrate therebetween, the contacts are located on the second component, and the components are movable relative to one another to ensure proper contact between the contacts and the terminals.

7. The tester apparatus of claim 6, wherein the second component includes a distribution board, and a ratio of a coefficient of thermal expansion of the distribution board to a coefficient of thermal expansion of the first component is at least 1.5.

8. The tester apparatus of claim 7, wherein the substrate heats from a first substrate temperature to a second substrate temperature during testing of the microelectronic circuit, and the distribution board heats from a first distribution board temperature to a second distribution board temperature, and a temperature change ratio, being a difference between the second distribution board temperature and the first distribution board temperature to a difference between the second substrate temperature and the first substrate temperature, is at least 1.5.

9. The tester apparatus of claim 7, wherein the coefficient of thermal expansion ratio multiplied by the temperature change ratio is between 0.85 and 1.15.

10. The tester apparatus of claim 7, wherein the first component is a substrate chuck having a surface supporting the substrate.

11. The tester apparatus of claim 6, further comprising:
a pressure differential cavity seal between the first and second components, the pressure differential cavity seal forming an enclosed pressure differential cavity together with surfaces of the first and second components; and
a pressure reduction passage within the pressure differential cavity through which air can be removed from the pressure differential cavity to move the first and second components relatively towards one another.

12. The tester apparatus of claim 11, wherein the pressure differential cavity seal surrounds the contacts and the terminals.

13. The tester apparatus of claim 11, wherein the pressure differential cavity seal is secured to the first component when the first and second components are apart.

14. The tester apparatus of claim 11, wherein the pressure differential cavity seal is a lip seal.

15. The tester apparatus of claim 11, wherein a pressure reduction passage is formed through one of the components, the pressure reduction passage having an inlet opening at the pressure differential cavity and an outlet opening outside the pressure differential cavity; and
a first valve in the component having the pressure reduction passage, opening of the first valve allowing air out of the pressure differential cavity and closing of the valve keeping air from entering the pressure differential cavity.

16. The tester apparatus of claim 15, wherein the first valve is a check valve, a vacuum release passage being formed through the component having the check valve, the vacuum release passage having an inlet opening at the pressure differential cavity and an outlet opening outside the pressure differential cavity; and
a second, vacuum release valve in the component having the vacuum release passage, opening of the vacuum release valve allowing air into the pressure differential cavity and closing of the valve keeping air from escaping out of the pressure differential cavity.

17. The tester apparatus of claim 6, further comprising a substrate suction passage in the first component, through which air can be pumped to reduce a pressure on a side of the substrate facing the first component to hold the substrate against the first component.

18. The tester apparatus of claim 6, wherein the contacts are resiliently depressible by the terminals, further comprising:
a stand-off on the second component, the stand-off having a surface that limits depression of at least one of the contacts.

19. The tester apparatus of claim 18, wherein a plurality of separated stand-offs are located between the contacts.

20. The tester apparatus of claim 18, further comprising:
a layer having a first side that is adhesive and attached to the second component and a second, opposite side that is adhesive, and the stand-off is attached to the second side.

21. The tester apparatus of claim 5, wherein the first interface includes a plurality of lands and the second interface includes a plurality of members having contact surfaces that match with the lands and are resiliently depressible by the lands enabling movement relative to the structure of the stationary structure.

22. The tester apparatus of claim 21, wherein the lands and the terminals are in parallel planes.

23. The tester apparatus of claim 21, wherein the stationary structure includes a thermal chuck, the portable supporting structure contacting the thermal chuck to allow for transfer of heat between the portable supporting structure and the thermal chuck.

24. The tester apparatus of claim 23, wherein a thermal interface cavity is defined between the portable supporting structure and the thermal chuck and a thermal interface vacuum passage is formed through the thermal chuck to the thermal interface vacuum.

25. The tester apparatus of claim 24, further comprising:
a thermal interface cavity seal contacting both the portable supporting structure and the thermal chuck so that the thermal interface cavity seal defines the thermal interface cavity together with the portable supporting structure and the thermal chuck.

26. The tester apparatus of claim 5, wherein the thermal control passage has a fourth section in series after the third section along the path of the fluid, the fourth section being located between the second and third sections.

27. The tester apparatus of claim 26, wherein the thermal control passage has a fourth section in series after the third section along the path of the fluid, the fourth section being located between the first and second sections.

28. The tester apparatus of claim 5, wherein the first, second, and third sections are sections of a first spiral.

29. The tester apparatus of claim 5, wherein the first and second sections are sections of a first spiral and the third section is a section of a second spiral that is not located on the first spiral.

30. The tester apparatus of claim 5, further comprising:
a heater, heat being transferred to the fluid by the heater when the fluid is outside the thermal control passage.

31. The tester apparatus of claim 30, wherein the heater is an electric heater.

32. The tester apparatus of claim 30, wherein heat is transferred from the substrate to the fluid that enters the fluid inlet at above 21 degrees Celsius.

33. The tester apparatus of claim 32, wherein heat is first transferred from the fluid to the substrate after the fluid enters the fluid inlet at above 21 degrees Celsius.

34. The tester apparatus of claim 30, wherein the fluid has a temperature above 100 degrees Celsius when the fluid enters the fluid inlet.

35. The tester apparatus of claim 30, wherein the fluid is recirculated.

36. The tester apparatus of claim 5, further comprising:
at least one interface actuator having first and second actuator pieces that are actuable relative to one another to move the portable supporting structure relative to the stationary structure and engage the first interface with the second interface.

37. The tester apparatus of claim 36, wherein the first and second pieces are a cylinder and a piston, respectively, the piston sliding along an internal surface of the cylinder.

38. The tester apparatus of claim 5, wherein the test that is carried out on the microelectronic circuit by the tester is a burn-in test.

39. The tester apparatus of claim 5, wherein the substrate is a wafer with a plurality of microelectronic circuits.

40. The tester apparatus of claim 5, wherein the contacts are pins, each pin having a spring that is depressed against a spring force thereof when the respective contact is depressed by a respective one of the terminals.

41. A method of testing a microelectronic circuit held by a substrate, comprising:
holding the substrate in a portable supporting structure having contacts against terminals of the substrate connected to the microelectronic circuit;
receiving the portable supporting structure by a stationary structure with a first interface on the portable supporting structure connected to a second interface on the stationary structure;
passing a fluid from a fluid inlet to a fluid outlet through a thermal control passage in a thermal chuck on the stationary structure, the thermal control passage having at least first, second, and third sections in series after one another along a path of the fluid and the third section is located between the first and second sections in cross-sectional plan view;
transferring heat between the fluid in the thermal control passage and the substrate to control a temperature of the substrate; and
transmitting signals between an electrical tester and the microelectronic circuit through the terminals, contacts, and first and second interfaces to test the microelectronic circuit.

42. The method of claim 41, wherein the substrate is held between first and second components of the portable supporting structure and the contacts are on the second component, further comprising:
moving the first and second components relatively towards one another to ensure proper contact between the contacts and the terminals.

43. The method of claim 42, wherein the second component includes a distribution board, and a coefficient of thermal expansion ratio of a coefficient of thermal expansion of the distribution board to a coefficient of thermal expansion of the first component is at least 1.5.

44. The method of claim 43, wherein the substrate heats from a first substrate temperature to a second substrate temperature during testing of the microelectronic circuit, and the distribution board heats from a first distribution board temperature to a second distribution board temperature, and a temperature change ratio, being a difference between the second distribution board temperature and the first distribution board temperature to a difference between the second substrate temperature and the first substrate temperature, is at least 1.5.

45. The method of claim 43, wherein the coefficient of thermal expansion ratio multiplied by the temperature change ratio is between 0.85 and 1.15.

46. The method of claim 43, wherein the first component is a substrate chuck having a surface supporting the substrate.

47. The method of claim 42, further comprising:
locating a pressure differential cavity seal between the first and second components to form an enclosed cavity by surfaces of the first and second components and the pressure differential cavity seal; and
reducing a pressure within the pressure differential cavity seal cavity to move the first and second components relatively towards one another.

48. The method of claim 47, wherein the pressure differential cavity seal surrounds the contacts and the terminals.

49. The method of claim 47, wherein the pressure differential cavity seal is secured to the first component when the first and second components are apart.

50. The method of claim 47, wherein the substrate cavity seal is created with a lip seal.

51. The method of claim 47, wherein a pressure reduction passage is formed through one of the components, the pressure reduction passage having an inlet opening at the pressure differential cavity and an outlet opening outside the pressure differential cavity; and
a first valve in the component having the pressure reduction passage, further comprising:
opening of the first valve to allow air out of the pressure differential cavity; and
closing the first valve, keeping air from entering the pressure differential cavity.

52. The method of claim 51, wherein the first valve is a check valve, a vacuum release passage being formed through the component having the check valve, the vacuum release passage having an inlet opening at the pressure differential cavity and an outlet opening outside the pressure differential cavity; and
a second, vacuum release valve in the component having the vacuum release passage, further comprising:
opening of the vacuum release valve to allow air into the pressure differential cavity; and
closing of the valve, keeping air from escaping out of the pressure differential cavity.

53. The method of claim 51, wherein a pressure within the pressure differential cavity is created before the portable supporting structure is received by the stationary structure.

54. The method of claim 42, further comprising pumping air through a substrate suction passage in the first component to reduce a pressure on a side of the substrate facing the first component and holding the substrate against the first component.

55. The method of claim 42, wherein the contacts are resiliently depressible by the terminals, further comprising:
limiting depression of at least one of the contacts with a surface of a stand-off on the second component.

56. The method of claim 55, wherein a plurality of separated stand-offs is located between the contacts.

57. The method of claim 55, further comprising:
a layer having a first side that is adhesive and attached to the second component and a second, opposite side that is adhesive, and the stand-off is attached to the second side.

58. The method of claim 41, further comprising:
locating lands of a first interface on the portable supporting structure against a plurality of matching members of a second interface on the stationary structure; and
resiliently depressing the members with the lands.

59. The method of claim 58, further comprising:
locating a surface of the portable supporting structure against a surface of a thermal chuck on the stationary structure; and
transferring heat through the surfaces.

60. The method of claim 59, further comprising:
reducing a pressure of air in a thermal interface cavity defined between the surfaces of the portable supporting structure and the thermal chuck.

61. The method of claim 60, wherein a thermal interface cavity is defined between the portable supporting structure and the thermal chuck and a thermal interface vacuum passage is formed through the thermal chuck to the thermal interface vacuum.

62. The method of claim 61, further comprising:
locating a thermal interface cavity seal between the portable supporting structure and the thermal chuck so that the thermal interface cavity is defined by the thermal interface cavity seal together with the portable supporting structure and the thermal chuck.

63. The method of claim 41, wherein the thermal control passage has a fourth section in series after the third section along the path of the fluid, the fourth section being located between the second and third sections.

64. The method of claim 63, wherein a temperature of the thermal chuck between the second and third sections is between a temperature of the fluid in the first and second sections and a temperature of the thermal chuck between the first and fourth sections is between a temperature of the fluid in the first and second sections.

65. The method of claim 64, wherein there is a larger temperature difference between the fluid in the first and fourth sections than between the fluid in the second and third sections.

66. The method of claim 63, wherein the thermal control passage has a fourth section in series after the third section along the path of the fluid, the fourth section being located between the first and second sections.

67. The method of claim 41, wherein the first, second, and third sections are sections of a first spiral.

68. The method of claim 41, wherein the first and second sections are sections of a first spiral and the third section is a section of a second spiral that is not located on the first spiral.

69. The method of claim 41, wherein the fluid has a temperature above 21 degrees Celsius when the fluid enters the fluid inlet.

70. The method of claim 69, wherein heat is transferred from the substrate to the fluid that enters the fluid inlet at above 21 degrees Celsius.

71. The method of claim 70, wherein heat is first transferred from the fluid to the substrate after the fluid enters the fluid inlet at above 21 degrees Celsius.

72. The method of claim 69, wherein the fluid has a temperature above 100 degrees Celsius when the fluid enters the fluid inlet.

73. The method of claim 69, wherein the fluid is recirculated.

74. The method of claim 41, wherein the test that is carried out on the microelectronic circuit is a burn-in test.

75. The method of claim 41, wherein the substrate is a wafer with a plurality of microelectronic circuits.

76. The method of claim 41, wherein the contacts are pins, each pin having a spring that is depressed against a spring force thereof when the respective contact is depressed by a respective one of the terminals.

* * * * *